(12) United States Patent
Noboru et al.

(10) Patent No.: US 7,884,921 B2
(45) Date of Patent: Feb. 8, 2011

(54) ILLUMINATION OPTICAL APPARATUS, PROJECTION EXPOSURE APPARATUS, PROJECTION OPTICAL SYSTEM, AND DEVICE MANUFACTURING METHOD

(75) Inventors: Michio Noboru, Kawasaki (JP); Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 480 days.

(21) Appl. No.: 11/783,557

(22) Filed: Apr. 10, 2007

(65) Prior Publication Data
US 2007/0242363 A1 Oct. 18, 2007

Related U.S. Application Data

(60) Provisional application No. 60/897,872, filed on Jan. 29, 2007.

(30) Foreign Application Priority Data

Apr. 12, 2006 (JP) .............................. 2006-110342

(51) Int. Cl.
| | | |
|---|---|---|
| G02B 27/10 | (2006.01) | |
| G03B 27/42 | (2006.01) | |
| G03B 27/44 | (2006.01) | |
| G03B 27/54 | (2006.01) | |
| G03B 27/52 | (2006.01) | |

(52) U.S. Cl. .............................. 355/67; 355/46; 355/53; 355/55; 359/618

(58) Field of Classification Search .................. 355/46, 355/53, 67, 55, 71; 250/492.2; 359/618, 359/629, 639, 640, 833, 834, 836
See application file for complete search history.

(56) References Cited

U.S. PATENT DOCUMENTS

| | | | |
|---|---|---|---|
| 5,724,122 A * | 3/1998 | Oskotsky ...................... | 355/67 |
| 6,249,382 B1 | 6/2001 | Komatsuda | |
| 6,383,940 B1 | 5/2002 | Yoshimura | |
| 6,611,316 B2 | 8/2003 | Sewell | |
| 6,628,372 B2 | 9/2003 | McCullough et al. | |
| 2005/0213070 A1* | 9/2005 | Scharnweber ................ | 355/69 |
| 2005/0274898 A1* | 12/2005 | Watanabe et al. ........... | 250/372 |
| 2006/0055834 A1 | 3/2006 | Tanitsu et al. | |
| 2006/0158624 A1 | 7/2006 | Toyoda | |

(Continued)

FOREIGN PATENT DOCUMENTS

JP A 11-111601 4/1999

(Continued)

*Primary Examiner*—Hung Henry Nguyen
*Assistant Examiner*—Colin Kreutzer
(74) *Attorney, Agent, or Firm*—Oliff & Berridge, PLC

(57) ABSTRACT

An illumination optical apparatus, used in a projection exposure apparatus for projecting and exposing a pattern arranged in a first plane to a second plane, for supplying the first surface with illumination light from a light source comprises an optical path combiner arranged in an optical path between the light source and the first surface, for combining a plurality of light beams different from each other from the light source such that the first and second light beams illuminate the first surface closely to each other. The optical path combiner includes a discrete point positioned on or near a third surface optically conjugate with the first surface. The plurality of light beams travel by way of a plurality of regions sectioned by the discrete point, respectively.

28 Claims, 30 Drawing Sheets

U.S. PATENT DOCUMENTS

| | | |
|---|---|---|
| 2006/0170901 A1 | 8/2006 | Tanitsu et al. |
| 2006/0286482 A1* | 12/2006 | Sewell ..................... 430/270.1 |
| 2007/0013885 A1 | 1/2007 | Loopstra et al. |
| 2007/0013890 A1 | 1/2007 | Loopstra et al. |
| 2007/0013893 A1 | 1/2007 | Loopstra |
| 2007/0013894 A1 | 1/2007 | Loopstra |
| 2007/0014112 A1 | 1/2007 | Ohya et al. |
| 2007/0242249 A1* | 10/2007 | Shibazaki et al. ............. 355/55 |
| 2009/0040490 A1* | 2/2009 | Shigematsu et al. ........... 355/66 |
| 2009/0153819 A1* | 6/2009 | Okita .......................... 355/53 |
| 2010/0123883 A1* | 5/2010 | Ohmura ....................... 355/51 |

FOREIGN PATENT DOCUMENTS

| | | |
|---|---|---|
| JP | A 2000-21742 | 1/2000 |
| JP | A 2000-21748 | 1/2000 |
| JP | A 2000-31028 | 1/2000 |
| JP | A 2001-297976 | 10/2001 |
| WO | WO 99/49504 A1 | 9/1999 |
| WO | WO 2004/019128 A2 | 3/2004 |

* cited by examiner

ILLUMINATION OPTICAL APPARATUS, PROJECTION EXPOSURE APPARATUS, PROJECTION OPTICAL SYSTEM, AND DEVICE MANUFACTURING METHOD

CROSS-REFERENCE TO RELATED APPLICATIONS

This application is based upon and claims the benefit of priorities from U.S. Provisional Application (the application number has not been assigned yet) filed on Jan. 29, 2007, and Japanese Patent Application No. 2006-110342 filed on Apr. 12, 2006, the entire contents of which are incorporated herein by reference.

BACKGROUND

1. Field

One embodiment of the present invention relates to illumination and exposure techniques employed for projecting a pattern of a first plane onto a second plane, and is applicable when used for transferring a mask pattern onto a photosensitive substrate in a lithography step for manufacturing various devices such as semiconductor devices, liquid crystal display devices, and thin-film magnetic heads, for example.

2. Description of the Related Art

A double exposure method is one of exposure methods for transferring a pattern of a reticle as a mask onto a wafer (or glass plate or the like) coated with a photoresist, which is used when manufacturing a semiconductor device or the like. When a pattern in which periodic and isolated patterns are mixed is exposed to one layer on a wafer, for example, this technique divides the reticle pattern into a first pattern corresponding to the periodic pattern and a second pattern corresponding to the isolated pattern, and subjects these two patterns to double exposure while successively optimizing their exposure conditions, thereby yielding a high imaging performance. Such a double exposure method has conventionally carried out exposure by performing the first exposure by using a first reticle formed with one or a plurality of first patterns and then performing the second exposure by replacing the reticle with a second reticle formed with one or a plurality of second patterns. However, a high throughput cannot be obtained when carrying out the exposure by exchanging the reticles as such.

Therefore, an exposure method has been proposed in Japanese Patent Application Laid-Open No. HEI 11-111601, which forms a single reticle with first and second patterns beforehand, transfers the patterns of the reticle to first and second shot regions adjacent to each other on a wafer by a scanning exposure scheme, and then transfers the reticle patterns to the second and third shot regions on the wafer after moving the wafer stepwise by one shot region, thereby double-exposing the first and second patterns to the second shot region. By changing illumination conditions when illuminating the first and second patterns in a predetermined illumination region at the time of scanning exposure, this exposure method can optimize the illumination conditions for these two patterns.

SUMMARY

In view of such circumstances, an embodiment of the present invention provides illumination and exposure techniques which can illuminate entire surface of each of individual patterns under corresponding optimal conditions when transferring two patterns arranged close to each other or patterns within two pattern regions arranged close to each other onto a photosensitive substrate.

It is another embodiment of the present invention to provide optical, exposure, and device-manufacturing techniques which can carry out double exposure with a high throughput and perform exposure under optimal illumination conditions for entire regions of individual patterns or patterns within individual pattern regions subjected to the double exposure.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

The illumination optical apparatus in accordance with an embodiment of the present invention is an illumination optical apparatus, used in a projection exposure apparatus for projecting and exposing a pattern arranged in a first plane to a second plane, for supplying the first plane with illumination light from a light source, the illumination optical apparatus comprising a relay optical system, arranged between the light source and the first plane, for forming a third plane optically conjugate with the first plane between the light source and the first plane; and an optical path combiner, arranged in an optical path between the light source and the first plane, for combining a first light beam from the light source and a second light beam different from the first light beam such that the first and second light beams illuminate the first plane closely to each other; wherein the optical path combiner includes a first region corresponding to the first light beam and a second region, separated from the first region, corresponding to the second light beam; and wherein a boundary between the first and second regions is arranged on or near the third plane.

By illuminating two patterns or patterns within two pattern regions with the first and second light beams, respectively, the above embodiment can illuminate entire surface of each pattern under their optimal illumination conditions.

The illumination optical apparatus in accordance with another embodiment of the present invention is an illumination optical apparatus, used in a projection exposure apparatus for projecting and exposing a pattern arranged in a first plane to a second plane, for supplying the first plane with illumination light from a light source, the illumination optical apparatus comprising an optical path combiner, arranged in an optical path between the light source and the first plane, for combining a plurality of light beams different from each other from the light source such that the first and second light beams illuminate the first plane closely to each other; wherein the optical path combiner includes a discrete point positioned on or near a third plane optically conjugate with the first plane; and wherein the plurality of light beams travel by way of a plurality of regions sectioned by the discrete point, respectively.

By illuminating two patterns or patterns within two pattern regions with first and second light beams, for example, out of the plurality of light beams, respectively, the above embodiment can illuminate entire regions of the patterns under their optimal illumination conditions.

The projection exposure apparatus in accordance with an embodiment of the present invention is a projection exposure apparatus for illuminating a pattern with illumination light and exposing a photosensitive substrate through the pattern and a projection optical system, the projection exposure apparatus comprising any of the illumination optical apparatus of the present invention for illuminating the pattern.

The device manufacturing method in accordance with an embodiment of the present invention uses a projection exposure apparatus of an embodiment of the present invention. In one example of this device manufacturing method, a pattern to be exposed has first and second pattern regions arranged along a scanning direction, and patterns in the first and second pattern regions are respectively transferred to first and second sectioned regions adjacent to each other on a substrate by one scanning exposure while being respectively illuminated with the first and second light beams.

In this case, patterns within two pattern regions are transferred to two sectioned regions on a photosensitive substrate by one scanning exposure, whereby double exposure can be carried out with a high throughput by moving the substrate stepwise by one sectioned region in the next exposure.

In a projection exposure apparatus illuminating first and second pattern regions arranged along a predetermined scanning direction with first and second light beams, respectively; and, in synchronization with moving a pattern having the first and second pattern regions while exposing a photosensitive substrate by the first and second light beams respectively passed through the first and second pattern regions, moving the substrate in a direction corresponding thereto, so as to transfer patterns of the first and second pattern regions to first and second sectioned regions adjacent to each other on the substrate by one scanning exposure, respectively; the projection optical system in accordance with an embodiment of the present invention is a projection optical system used for exposing the substrate by the first and second light beams respectively passed through the first and second pattern regions, the projection optical system comprising an image shifter for shifting positions of respective images formed by the first and second light beams relative to each other.

According to the above embodiment, patterns within two pattern regions are respectively transferred to two sectioned regions on a photosensitive substrate by one scanning exposure in the projection exposure apparatus, whereby double exposure can be carried out with a high throughput by moving the substrate stepwise by one sectioned region in the next exposure. Since there is an image shifter here, the two pattern regions can be arranged so as to be separated from each other in the scanning direction, whereby in the next exposure of each of the two pattern regions can easily be illuminated under its optimal illumination conditions.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION OF THE EMBODIMENTS

First Embodiment

In the following, a first embodiment of the present invention will be explained with reference to FIGS. 1 to 10. This example employs the embodiment in a case carrying out exposure by using a projection exposure apparatus of scanning stepper type which performs in a scanning exposure scheme.

Figure 1:
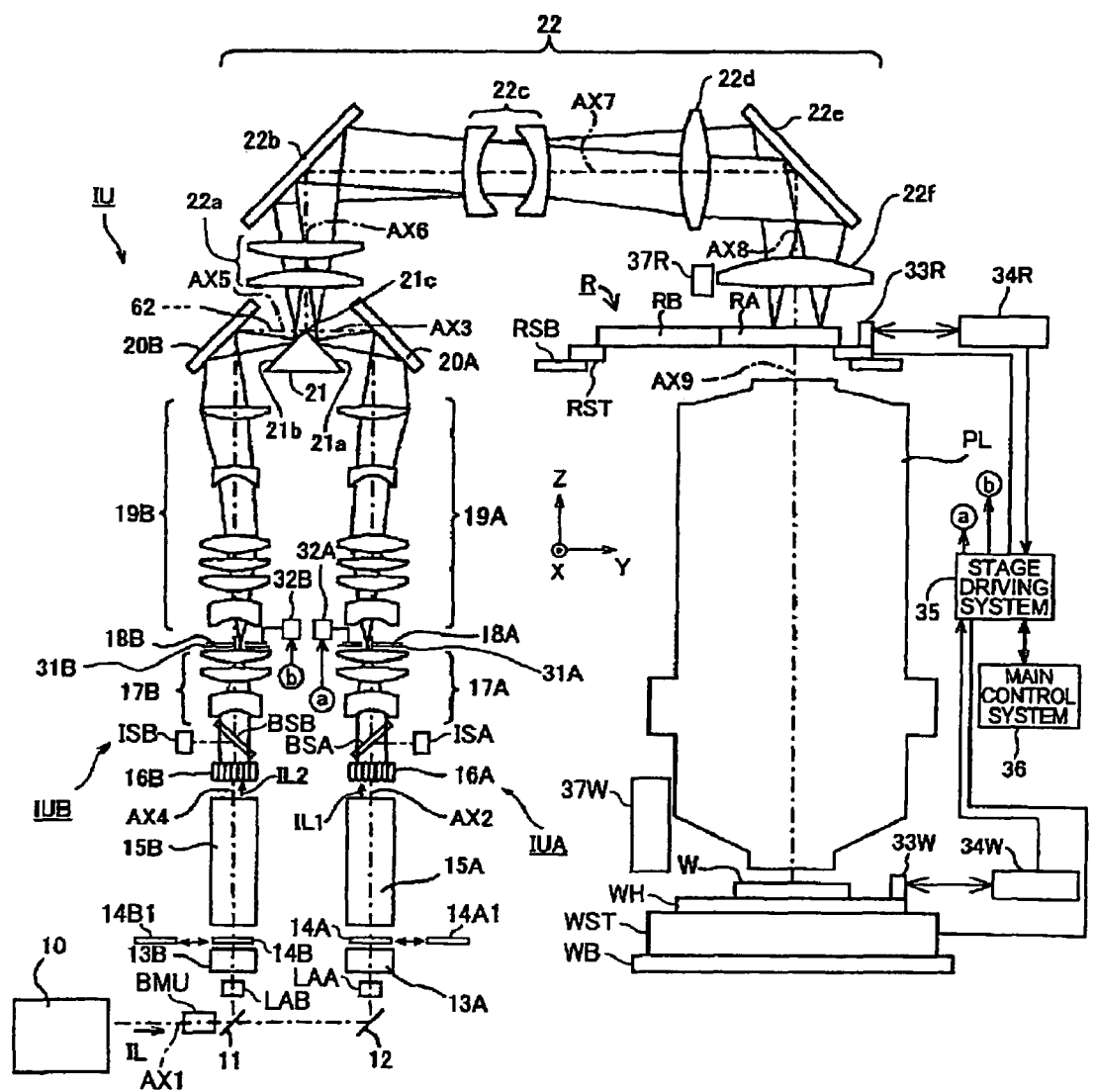
FIG. 1 is a view showing the structure of the projection exposure apparatus in accordance with the first embodiment of the present invention.

FIG. 1 shows the projection exposure apparatus in accordance with this example. In FIG. 1, the projection exposure apparatus comprises an exposure light source 10, an illumination optical system IU for illuminating a reticle R as a mask with exposure light from the exposure light source 10, a reticle stage RST for moving the reticle R while holding the same, a projection optical system PL for projecting an image of a pattern within an illumination region of the reticle R onto a wafer W coated with a photoresist (photosensitive material) as a photosensitive substrate, a wafer stage WST for moving the wafer W while holding the same, driving mechanisms for these stages and the like, and a main control system 36 for totally regulating operations of the driving mechanisms and the like. Though ArF excimer laser (having a wavelength of 193 nm) is used as the exposure light source 10, harmonic generators such as KrF excimer laser (having a wavelength of 248 nm), $F_2$ laser (having a wavelength of 157 nm), and solid-state laser (YAG laser, semiconductor laser, or the like), mercury lamps, and the like can also be used as the exposure light source.

In the following explanation, Z axis is set parallel to the optical axis AX9 of the projection optical system PL, Y axis is set along a scanning direction (direction parallel to the page of FIG. 1) of the reticle R and wafer W at the time of scanning exposure within a plane perpendicular to the Z axis, and X axis is set along a nonscanning direction (direction perpendicular to the page of FIG. 1) perpendicular to the scanning direction.

Exposure light (exposure illumination light) IL constituted by linearly polarized UV (ultraviolet) pulsed laser light emitted from the exposure light source 10 is made incident on an optical divider 11 through a beam matching unit BMU along an optical axis AX1, so as to be divided into a first exposure light beam IL1 and a second exposure light beam IL2. The first exposure light beam IL1 is reflected by a mirror 12, so as to enter a first illumination unit IUA having an optical axis AX2, whereas the second exposure light beam IL2 enters a second illumination unit IUB having an optical axis AX4. In this case, a polarizing beam splitter (PBS) is used as the optical divider 11, while the polarizing direction of the exposure light IL incident on the optical divider 11 is set such that the light quantity of the first exposure light beam IL1 (p-polarized light component) transmitted through the optical divider 11 and the light quantity of the second exposure light beam IL2 (s-polarized light component) reflected by the optical divider 11 are equal to each other.

Rotatably providing a half-wave plate, which is not depicted, on the exposure light source 10 side of the optical divider 11, for example, can vary the polarizing direction of the exposure light IL incident on the optical divider 11, whereby the ratio between the light quantity of the first exposure light beam IL1 and the light quantity of the second exposure light beam IL2 (S-polarized light component) can be made variable. A half mirror can also be used as the optical divider 11. The optical divider 11 can also be construed as a multiple-light-beam generator which divides a light beam from a light source into a plurality of light beams, for example.

The first exposure light beam IL1 entering the first illumination unit IUA passes a light-attenuating unit LAA for regulating the light quantity (illuminance) in a plurality of stages, a polarization controller 13A for regulating the polarization state of the exposure light, a replaceable diffractive optical element (DOE) 14A for setting a light quantity distribution of exposure light on a pupil plane of the illumination optical system IU, and a shaping optical system 15A for regulating the cross-sectional form of exposure light, so as to be made incident on an optical integrator 16A. The polarizing controller 13A includes a quarter-wave plate and/or a half-wave plate, for example, and sets the polarization state of exited exposure light beam IL1 to linear polarization in a predetermined direction, circular polarization, or the like. This makes it possible to illuminate patterns of the reticle R with the first exposure light beam IL1 in desirable polarized illumination. Each of the illuminance of exposure light regulated by the light-attenuating unit LAA and the polarized illumination set by the polarization controller 13A is one of illumination conditions for the exposure light.

The diffractive optical element 14 can cause diffracted light by the incident first exposure light beam IL1 such that the light quantity of the diffracted light is distributed in an annular state in a far field, for example, thereby effecting annular illumination. In addition, diffractive optical elements 14A1 for effecting normal illumination, small a illumination with a small coherence factor (σ value), and so-called deformed illumination such as dipole and quadrupolar illuminations in which the light quantity becomes greater at two and four positions arranged so as to hold the optical axis between those positions on the pupil plane of the illumination optical system IU, respectively, are arranged so as to be replaceable with the diffractive optical element 14A. The main control system 36 selects any of these diffractive optical elements and places it on an optical path of the first exposure light beam IL1, thereby being able to set its corresponding illumination scheme (annular illumination, dipole illumination, or the like). Not only the light quantity distribution of exposure light on the pupil plane of the illumination optical system IU in this illumination scheme but also the incident angle distribution of exposure light on the reticle R is one of illumination conditions.

The shaping optical system 15A comprises an afocal system, a pair of prisms (e.g., those of a conical axicon system) which are arranged within the afocal system while at least one of them is movable, a zoom lens system arranged behind the afocal system, a replaceable polarization converter for setting the distribution of polarization state in a cross section of exposure light to a predetermined distribution (polarization characteristic distribution mainly composed of linearly polarized light in a circumferential direction (an azymuthal direction) on the pupil plane of the illumination optical system or the like), and the like. Detailed structures of the above-mentioned polarization controller 13A, diffractive optical element 14A, and shaping optical system 15A are disclosed in International Publication No. 2004/051717 Pamphlet and the corresponding U.S. Published Application No. 2006/0055834, International Publication No. 2005/076045 Pamphlet and the corresponding U.S. Published Application No. 2006/0170901, International Publication No. 2005/050718 Pamphlet and the corresponding U.S. Published Application No. 2006/0158624, and the like, for example. Though a fly's-eye lens (or micro-fly's-eye lens) is used as the optical integrator 16A in this example, an internal-reflection-type integrator (rod integrator or the like), a diffractive optical element, or the like may be used in place thereof U.S. Published Application No. 2006/0055834, U.S. Published Application No. 2006/0158624 and U.S. Published Application No. 2006/0170901 are incorporated as references herein.

A portion of the first exposure light beam IL1 having passed through the optical integrator 16A is caused to branch off by a beam splitter BSA, so as to be made incident on an integrator sensor ISA constituted by a photodetector, whereby its light quantity is measured, and the integrated amount of exposure light quantities at each point on the wafer W is indirectly monitored from the results of measurement The first exposure light beam IL1 transmitted through the beam splitter passes a condenser optical system 17A, thereby successively reaching a fixed blind (fixed field (illumination field) stop) 31A and a movable blind (movable field (illumination field) stop) 18A. In one example, the fixed blind 31A is placed on a surface slightly defocused from a plane optically conjugate with a pattern surface of the reticle R (hereinafter referred to as reticle surface), while the movable blind 18A is placed on the plane optically conjugate with the reticle surface. The fixed blind 31A is a field (illumination field) stop for defining an illumination region formed like a slit elongated in the nonscanning direction on the reticle R, whereas the movable blind 18A is driven by a driving mechanism 32A so as to control the illumination region such that regions other than desirable pattern regions on the reticle R are not irradiated with the first exposure light beam IL1 at the time of scanning exposure. The operation of the driving mechanism 32A is regulated by a stage driving system 35 which will be explained later. The movable blind 18A is also used for regulating the width of the illumination region in the nonscanning direction.

The above-mentioned polarization controller 13A, diffractive optical element 14A or the like, shaping optical system 15A, optical integrator 16A, and condenser optical system 17A construct the first illumination unit IUA, whereas the first exposure light beam having traveled the first illumination unit IUA reaches the fixed blind 31A and movable blind 18A.

The first exposure light beam IL1 transmitted through the movable blind 18A passes a first primary relay optical system 19A and an optical path folding mirror 20A, so as to be folded at substantially right angles, thereby advancing along an optical axis AX3, and thereafter is reflected by a reflecting surface 21a of an optical path combining mirror 21, so as to enter a secondary relay optical system 22 along an optical axis AX6. The optical path folding mirror 20A and optical path combining mirror 21 are arranged between the primary relay optical system 19A and the position where an image of the aperture of the movable blind 18A is formed. The secondary relay optical system 22 is an optical system which makes a predetermined plane 62 and a reticle surface optically conjugate with each other. This plane 62 will be referred to as a reticle conjugate plane 62 in the following.

The optical path combining mirror 21 is a reflecting member shaped like a rectangular prism comprising reflecting surfaces 21a and 21b orthogonal to each other, whereas a ridge line (line formed by an intersection of planes where reflecting surfaces are positioned) 21c formed by the reflecting surfaces 21a, 21b is substantially positioned on the reticle conjugate plane 62. The tolerance for the deviation of the ridge line 21c from the reticle conjugate plane 62 will be explained later. The ridge line 21c can also be construed as a discrete point.

On the other hand, the secondary illumination unit IUB comprises a light-attenuating unit LAB, a polarization controller 13B, diffractive optical elements 14B, 14B1 or the like, a shaping optical system 15B, an optical integrator 16B, a beam splitter BSB, an integrator sensor ISB, and a condenser optical system 17B, all of which have the same structures as those of their corresponding optical members in the first illumination unit IUA. The second exposure light beam IL2 entering the second illumination unit IUB is incident on a fixed blind 31B and a movable blind 18B (driven by a driving mechanism 32B under the control of the stage driving system 35) as with the first exposure light beam IL1. The second exposure light beam IL2 having transmitted through the movable blind 18B passes a second primary relay optical system 19B and an optical path folding mirror 20B, so as to advance along an optical axis AX5, and then is reflected by the reflecting surface 21b of the optical path combining mirror 21, thereby being made incident on the secondary relay optical system 22. The second primary relay optical system 19B forms an image of the aperture of the movable blind 18B on the reticle conjugate plane 62 in this case as well. Since the polarization controller 13B and diffractive optical element 14B or the like in the second illumination unit IUB are regulated independently of the polarization controller 13A and diffractive optical element 14A or the like in the first illumination unit IUA, the illuminance, illumination condition, and state of polarization of the second exposure light beam 1L2 can be set independently of those of the first exposure light beam IL1.

The optical path combining mirror 21 can be construed as an optical path combiner which is arranged between the exposure light source 10 and the reticle surface, i.e., on or near the reticle conjugate plane 62 in this example, and assembles the respective light beams from the first and second illumination units. IUA and IUB. The reflecting surfaces 21a and 21b of the optical path combining mirror 21 can be construed as the first and second regions of the optical path combiner, respectively. The reticle conjugate plane 62 can be construed as the third plane conjugate with the first plane where the pattern surface of the reticle R is positioned.

The structure mentioned above allows images of the plurality of movable blinds 18A and 18B to be positioned adjacent to each other on the reticle conjugate plane 62 even when a plurality of movable blinds 18A and 18B are arranged while being spatially separated from each other.

The exposure light beams IL2 and IL2 assembled by the optical path combining mirror 21 pass the second relay optical system 22 including a lens system 22a, an optical path folding mirror 22b, a lens system 22c, a lens system 22d, an optical path folding mirror 22e, and a lens system 22f, so as to illuminate patterns provided on the pattern surface (reticle surface) of the reticle R along optical axes AX6, AX7, AX8. The optical axis AX8 of the illumination optical system IU on the reticle R coincides with the optical axis AX9 of the projection optical system PL. The illumination optical system IU includes the above-mentioned illumination units IUA and IUB, fixed blinds 31A and 31B, movable blinds 18A and 18B, primary relay optical systems 19A and 19B, optical path folding mirrors 20A and 20B, optical path combining mirror 21, and secondary relay optical system 22.

Figure 2:
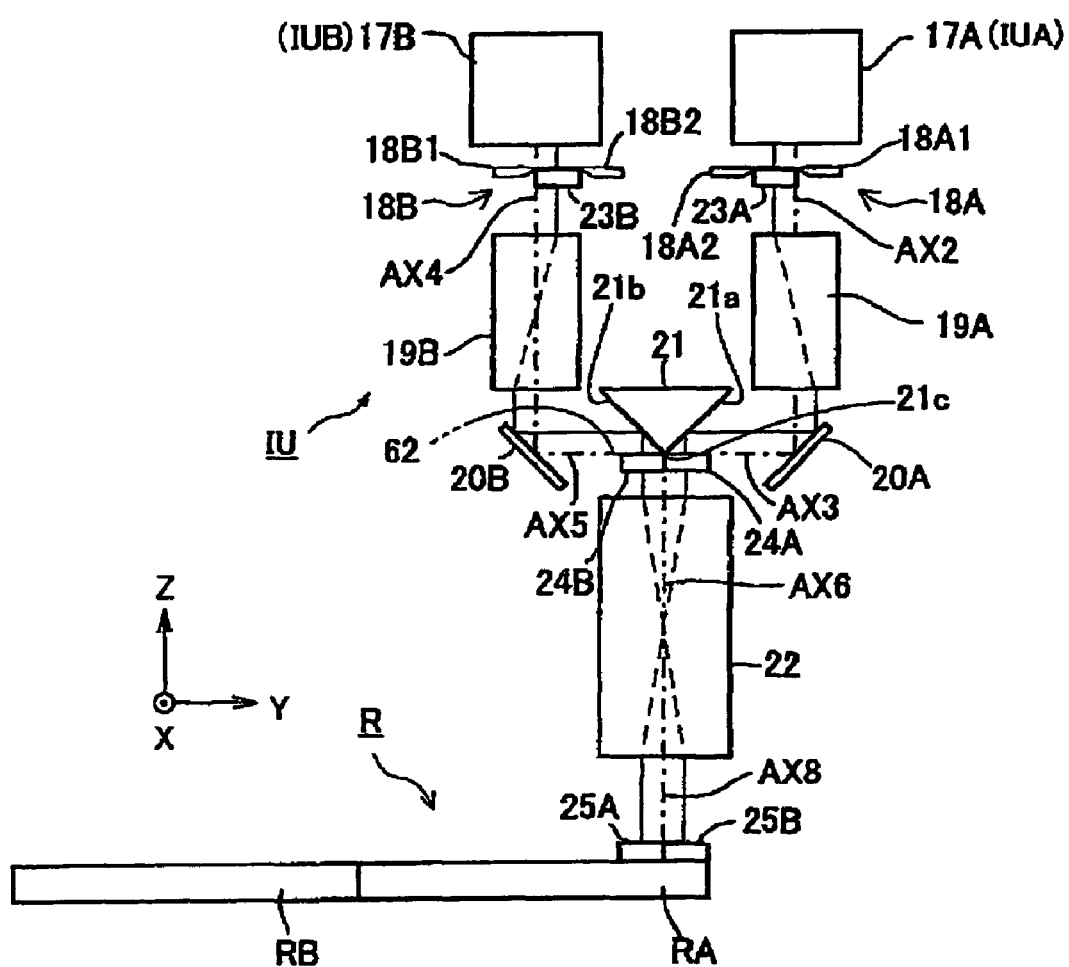
FIG. 2 is a view schematically showing the illumination optical system IU in the projection exposure apparatus of FIG. 1.

FIG. 2 is a view schematically showing the illumination optical system IU of FIG. 1 without depicting a plurality of optical path folding mirrors in the illumination optical system IU of FIG. 1. In FIG. 2, illumination regions 23A, 23B (apertures of the movable blinds 18A and 18B) formed by the exposure light beams exited from the condenser optical systems 17A, 17B of the illumination units IUA, IUB are located at positions decentered from the primary relay optical systems 19A, 19B acting as subsequent optical systems. For forming the decentered illumination regions 23A, 23B in the state without light quantity loss, the technique disclosed in Japanese Patent Application Laid-Open No. 2000-21765 and the corresponding U.S. Pat. No. 6,249,382 can be employed. U.S. Pat. No. 6,249,382 is incorporated as a reference herein.

These illumination regions 23A and 23B are reimaged as illumination regions 24A and 24B adjacent to each other on the reticle conjugate plane 62 by way of their corresponding primary relay optical systems 19A, 19B, optical path folding mirrors 20A, 20B, and reflecting surfaces 21a, 21b of the optical path combining mirror 21. The secondary relay optical system 22 reimages the illumination regions 24A and 24B adjacent to each other as a first illumination region 25A and a second illumination region 25B which are adjacent to each other on the reticle R, respectively. The widths of the apertures of the movable blinds 18A and 18B in the scanning direction (Y direction) of the reticle R are defined by their corresponding movable blinds 18A1, 18A2 and blinds 18B1, 18B2. The widths of the illumination regions 25A and 25B on the reticle R can be regulated by the widths of the apertures of the movable blinds 18A and 18B in the direction corresponding to the scanning direction.

Figure 3:
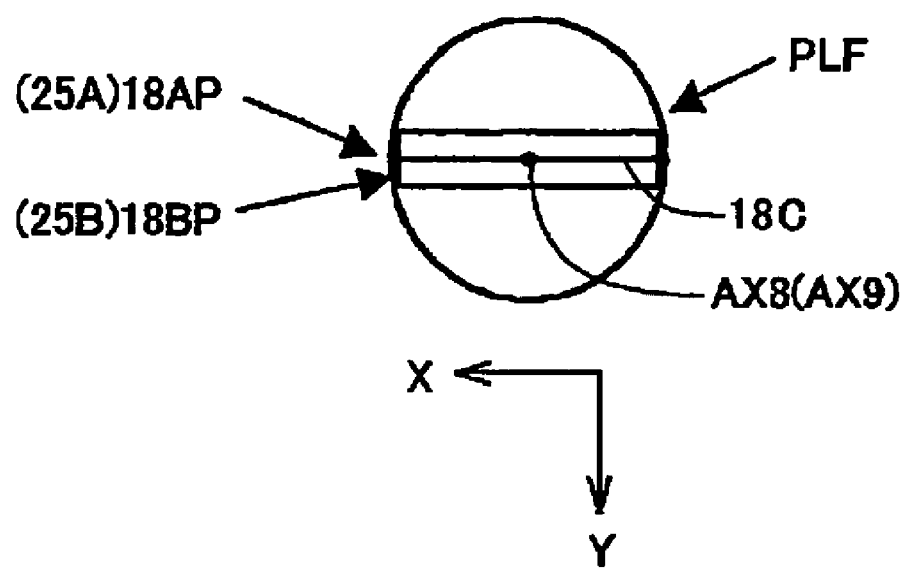
FIG. 3 is a view showing the relationship between the field of the projection optical system PL in the projection exposure apparatus of FIG. 1 and illumination fields.

FIG. 3 shows the relationship between the field PLF of the projection optical system PL in this example and a first and second illumination fields 18AP, 18BP which are images of fully opened apertures of the first and second movable blinds 18A and 18B, respectively. In FIG. 3, the first illumination field 18AP and second illumination field 18BP are rectangular regions having the same size elongated in the X direction (nonscanning direction). The first illumination field 18AP and second illumination field 18BP are adjacent to each other across a boundary line 18C which passes the optical axis AX8 (optical axis AX9 of the projection optical system PL) on the exit side of the secondary relay optical system 22 and is parallel to the X axis, and are substantially inscribed as a whole in the contour of the field PLF of the projection optical system PL. The boundary line 18C is also an image of the ridge line 21c of the optical path combining mirror 21 of FIG.

2 formed by the secondary relay optical system 22. The illumination fields 18AP and 18BP equal to the illumination regions 25A and 25B at maximum, respectively. In this example, the movable blinds 18A and 18B are opened and closed in the direction corresponding to the scanning direction during scanning exposure as will be explained later, so that the widths of the illumination regions 25A and 25B in the scanning direction are regulated according to the position of the reticle R in the scanning direction within the illumination fields 18AP and 18BP, respectively.

Returning to FIG. 1, under the exposure light beams IL1, IL2, the pattern within an illumination region of the reticle R is projected onto an exposure region on the wafer W coated with a photoresist at a predetermined projection magnification $\beta$ (where $\beta$ is ¼, ⅕, or the like) through the projection optical system PL. Namely, the projection optical system PL projects (projects and exposes) the pattern on the reticle surface acting as an object surface onto the surface of the wafer W acting as an image surface. The wafer W is a disk-shaped substrate having a diameter of 200 mm, 300 mm, or the like, for example. Employable as the projection optical system PL is not only a dioptric system, but also a catadioptric projection optical system which has an optical system having an optical axis directed from the reticle to the wafer and a catadioptric system having an optical axis substantially orthogonal to the former optical axis and forms intermediate images twice therewithin, or the like as disclosed in International Publication No. 2004/19128 Pamphlet. International Publication No. 2004/19128 Pamphlet is incorporated as a reference herein.

The reticle R is held on the reticle stage RST by suction, whereas the reticle stage RST is mounted on a reticle base RSB so as to be continuously movable in the Y direction by a linear motor or the like. Further, a mechanism for finely moving the reticle in rotary directions about the X direction, Y direction, and Z axis is built in the reticle stage RST. The position of the reticle stage RST (reticle R) is measured with a high accuracy by a movable mirror 33R on the reticle stage RST and a laser interferometer 34R arranged so as to oppose the mirror 33R, and the stage driving system 35 regulates operations of the reticle stage RST according to the results of measurement and the control information from the main control system 36. Also, according to the positional information of the reticle stage RST (and reticle R) in the Y direction (scanning direction), the stage driving system 35 regulates operations of opening and closing the movable blinds 18A and 18B, i.e., the widths of the illumination regions 25A and 25B in the Y direction in FIG. 2, through the driving mechanisms 32A and 32B, respectively. The operations of opening and closing the movable blinds 18A and 18B may also be regulated by controllers provided independently of the stage driving system 35.

On the other hand, the wafer W is held on the wafer stage WST by suction through a wafer holder WH. The wafer stage WST is constituted by a Z tilt stage for regulating the focus position (position in the Z direction) and angle of inclination of the wafer W, and an XY stage which is movable continuously in the Y direction and stepwise in the X and Y directions on a wafer base WB by a linear motor or the like. The position of the wafer holder WH (wafer W) is measured with a high accuracy by a movable mirror 33W on the wafer stage WST and a laser interferometer 34W arranged so as to oppose the mirror 33W, and the stage driving system 35 regulates operations of the wafer stage WST according to the results of measurement and the control information from the main control system 36. The image surface on which the reticle pattern image formed by the projection optical system PL is located can be construed as the second plane, whereas the surface of the wafer W is positioned at the second plane.

At the time of scanning exposure in the projection exposure apparatus in this example, in synchronization with moving the reticle R at a velocity VR in the Y direction by means of the reticle stage RST with respect to the illumination region, the wafer W is moved at a velocity $\beta \cdot VR$ (where $\beta$ is the projection magnification from the reticle R to the wafer W) in the Y direction by means of the wafer stage WST with respect to the exposure region, whereby pattern images within two pattern regions in series (which will be explained later in detail) of the reticle R are sequentially transferred to two shot regions adjacent to each other in the scanning direction on the wafer W. The respective scanning directions of the reticle R and wafer W are opposite to each other in the projection optical system PL of this example forming an inverted image. When the projection optical system PL projects an erected image in the scanning direction, the reticle R and wafer W are scanned in the same direction. Thereafter, the wafer stage WST is moved stepwise, so as to shift the next shot region on the wafer to a scanning start position, and scanning exposure is carried out. This operation is repeated in a step-and-scan scheme, so that the exposure is performed for each pair of shot regions adjacent to each other in the scanning direction on the wafer W.

When the exposure is overlay exposure, the reticle R and wafer W are required to be aligned with each other beforehand. Therefore, an alignment sensor 37W for detecting the position of an alignment mark provided in each shot region on the wafer W is placed at a side face of the projection optical system PL. Above the reticle stage RST, a pair of alignment microscopes of image processing type (not depicted) are placed in order to measure positions of alignment marks on the reticle R.

An example of exposure operations of the projection exposure apparatus in this example will now be explained Since the pattern surface of the reticle R in this example is formed with two pattern regions (transfer patterns) for double exposure along the scanning direction, the double exposure is assumed to be carried out in the following explanation.

Figure 4:
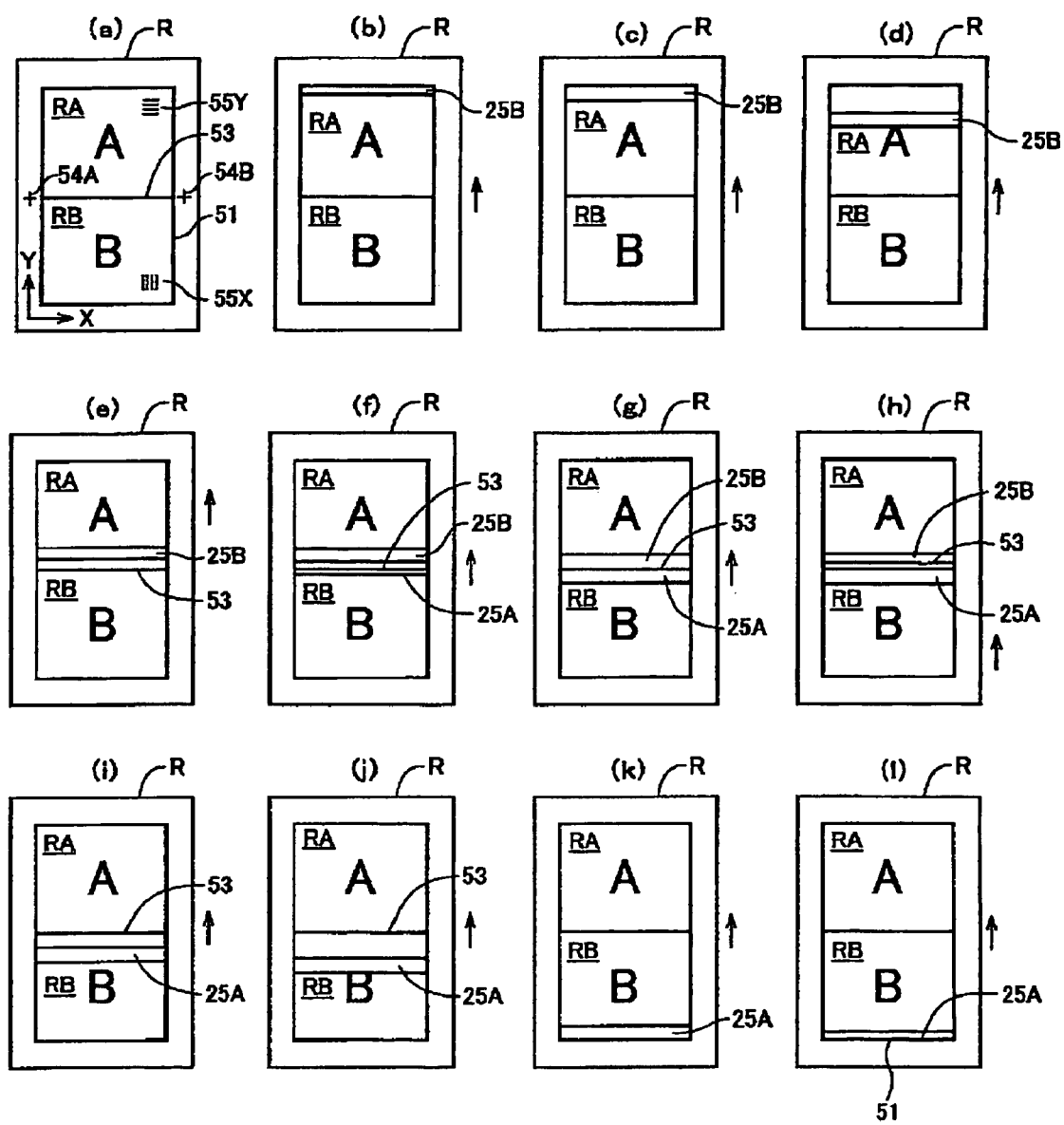
FIG. 4 is a view showing an example of changes in the positional relationship between the pattern regions RA, RB of the reticle R and the illumination regions 25A, 25B in FIG. 2.
Figure 5:
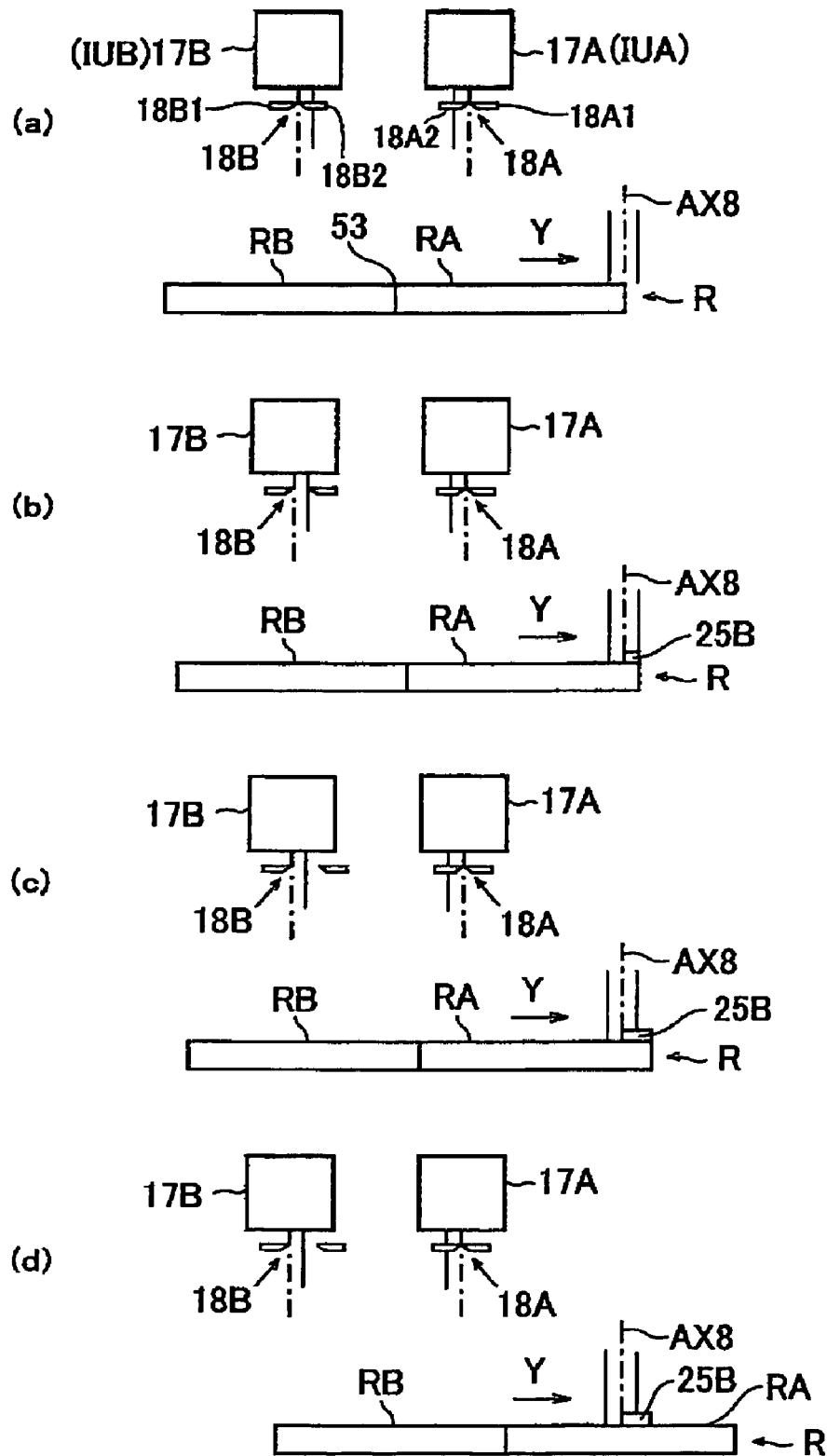
FIG. 5 is a view showing an example of changes in the apertures of the movable blinds 18A, 18B corresponding to the changes in the state on the first line of FIG. 4.
Figure 6:
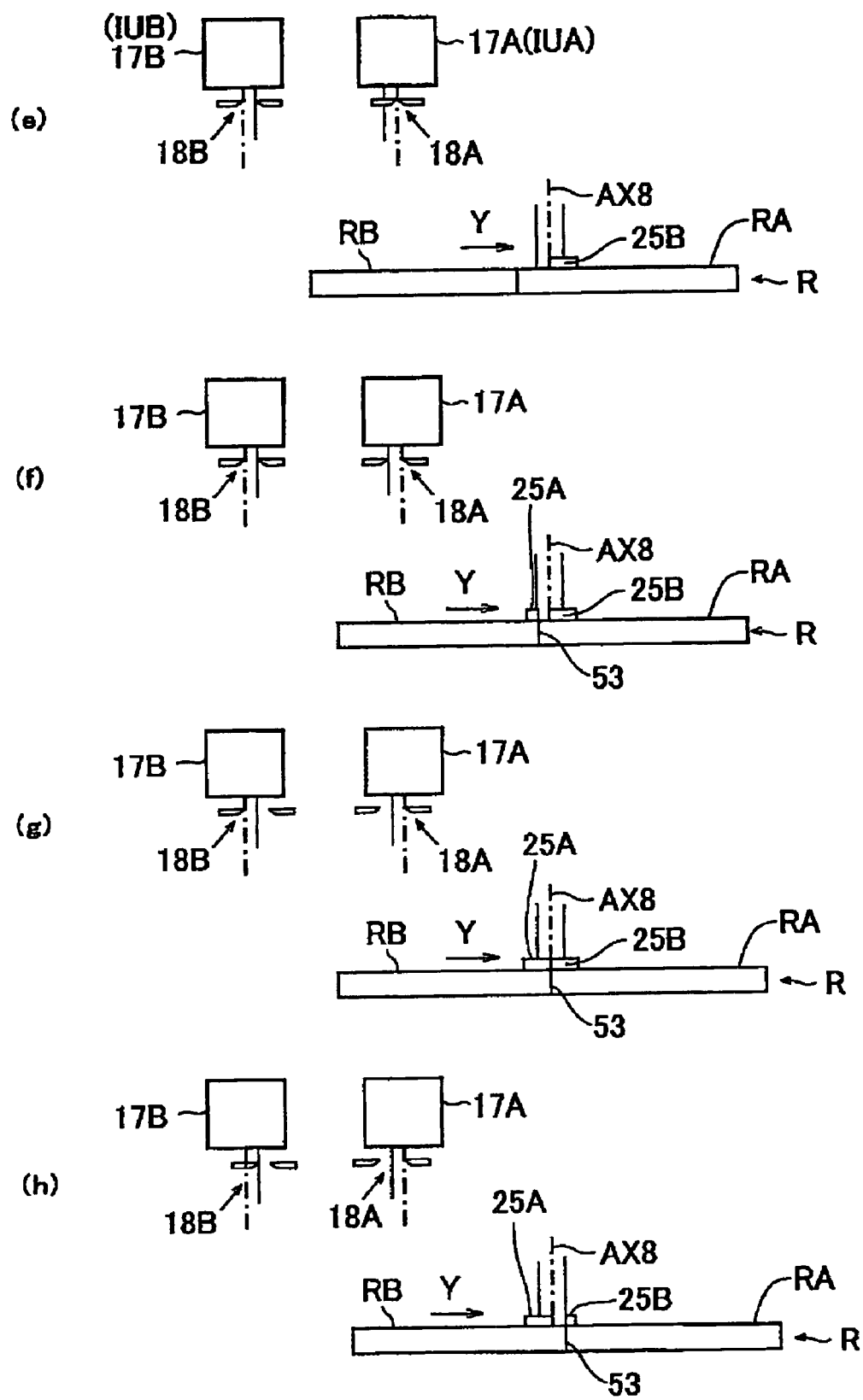
FIG. 6 is a view showing an example of changes in the apertures of the movable blinds 18A, 18B corresponding to the changes in the state on the second line of FIG. 4.
Figure 7:
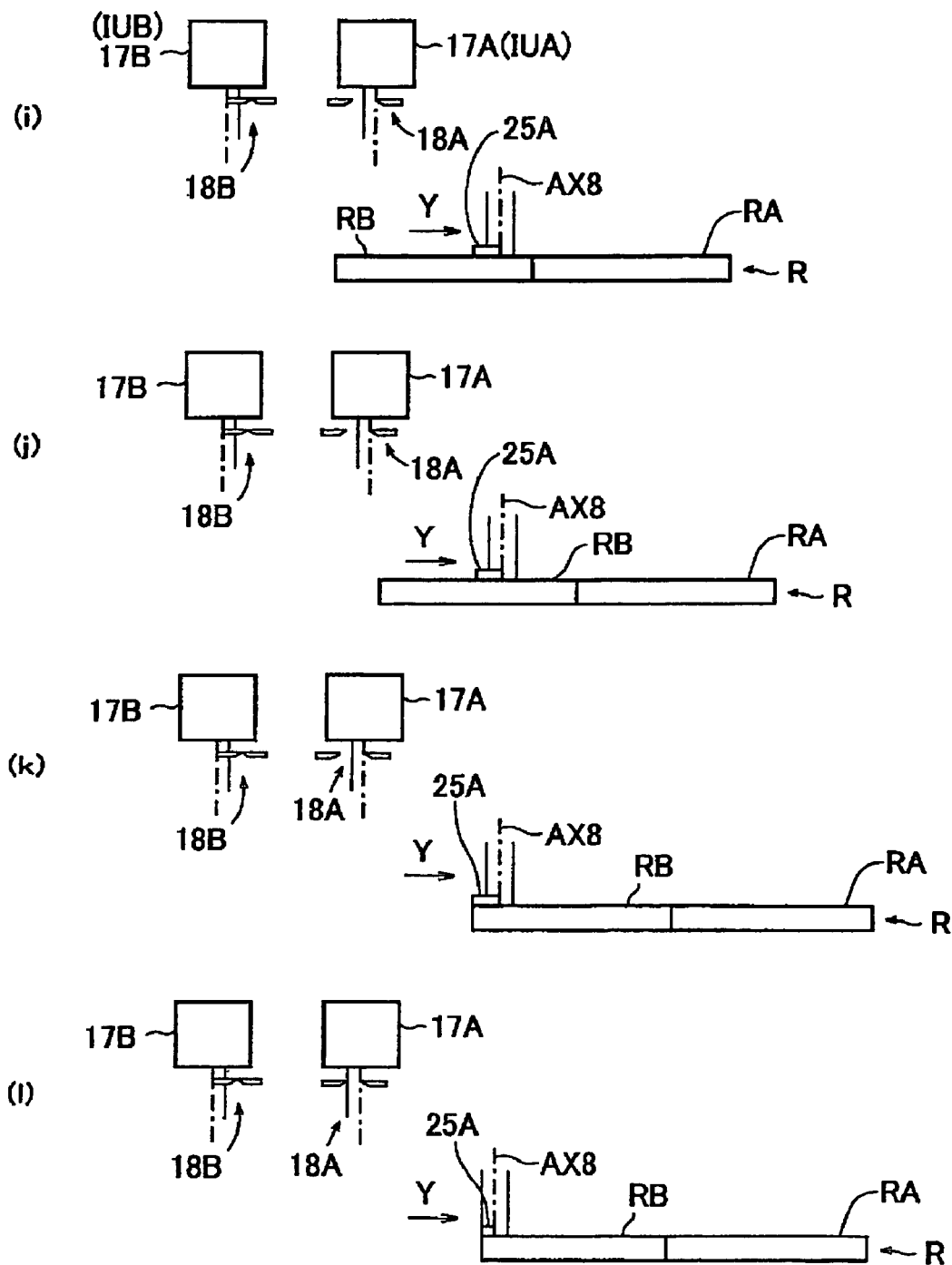
FIG. 7 is a view showing an example of changes in the apertures of the movable blinds 18A, 18B corresponding to the changes in the state on the third line of FIG. 4.

FIG. 4(*a*) is a plan view showing a pattern arrangement of the reticle R used in this example. In FIG. 4(*a*), the region surrounded by a rectangular frame-like light-shielding band 51 in the reticle R is divided by a boundary light-shielding band 53 into two in the Y direction, i.e., first and second pattern regions RA, RB having the same size. Different transfer patterns (hereinafter respectively referred to as patterns A and B) are drawn within the pattern regions RA, RB, respectively. The patterns A and B are patterns generated from a circuit pattern transferred to one layer of each shot region on the wafer W. A projection image corresponding to the circuit pattern is exposed to each shot region by overlaying images of the patterns A and B on each other. In one example, the pattern A is constituted by a line-and-space pattern (hereinafter referred to as L&S pattern) 55Y arranged with a pitch on the order of resolution limit in the Y direction, whereas the pattern B is constituted by an X-direction L&S pattern 55X arranged with a pitch on the order of resolution limit in the X direction.

Since the first illumination region 25A and second illumination region 25B in FIG. 2 illuminate the pattern B in the second pattern region RB and the pattern A in the first pattern region RA, respectively, in this example, an X-axis dipole illumination diffractive optical element (having two secondary light sources separated from each other in the direction corresponding to the X direction) for the X-direction L&S pattern 55X is employed as the first illumination unit IUA in FIG. 1, and a Y-axis dipole illumination diffractive optical element (having two secondary light sources separated from each other in the direction corresponding to the Y direction) for the Y-direction L&S pattern 55Y is employed as the second illumination unit IUB in order to enhance the resolving power. In this case, the illumination regions 25A and 25B are illuminated with dipole illuminations orthogonal to each other. When the pattern B is constituted by a periodic pattern while the pattern A is constituted by an isolated pattern, for example, the illumination scheme for the first illumination region 25A may be annular illumination while the illumination scheme for the second illumination region 25B may be small a illumination or the like.

The size of each of the pattern regions RA and RB in the reticle R of FIG. 4(*a*) corresponds to the size of one shot region on the wafer W, while the light-shielding band 53 at the boundary between the pattern regions RA and RB has a width corresponding to the width of a street line between adjacent shot regions on the wafer W. Namely, images into which the two pattern regions RA and RB are reduced at the projection magnification of the projection optical system PL correspond to the sizes of the two shot regions adjacent to each other in the scanning direction on the wafer W.

Here, the street line refers to a nondevice region arranged in each boundary portion of a plurality of semiconductor devices formed on a wafer, whereas its width is mainly about 100 µm at present When the width of the street line on the wafer W is 100 µm while the magnification of the projection optical system PL is ¼, the width of the light-shielding band 53 is 400 µm. This makes it necessary for the boundary portion of the first illumination region 25A and second illumination region 25B to accurately coincide with the pattern regions RA and RB with a positional tolerance of 400 µm or less.

For this purpose, it is necessary to lower positioning errors in edge portions of the movable blinds 18A and 18B and distortions in the movable blinds 18A and 18B and the primary relay optical systems 19A, 19B and secondary relay optical system 22 for relaying the movable blinds 18A, 18B and the reticle pattern surface, and suppress the deviation of the ridge line 21*c* of the optical path combining mirror 21 from the reticle conjugate plane 62 to a predetermined value or less. This is because, as the ridge line 22*c* deviates from the reticle conjugate plane 62, an image on the reticle pattern surface blurs because of defocusing, whereby the boundary of the first illumination region 25A and second illumination region 25B blurs.

Therefore, it will be acceptable if the amount of deviation of the ridge line 21*c* in the optical path combining mirror 21 from the reticle conjugate plane 62 is such that the blurred width of the boundary between the first illumination region 25A and second illumination region 25B is 400 µm or less as mentioned above, for example.

When the above-mentioned positioning errors in the movable blinds 18A and 18B and distortions in the relay optical systems are taken into consideration, it will be acceptable if the amount of deviation of the ridge line 21*c* from the reticle conjugate plane 62 is smaller.

The tolerance for the amount of deviation is the same in other embodiments and modified examples which will be explained later.

A pair of alignment marks 54A and 54B are formed so as to hold the pattern region of the reticle R between the marks 54A, 54B in the X direction. Measuring the positions of the alignment marks 54A and 54B with an alignment microscope 37R allows the reticle R to be aligned.

Figure 8:
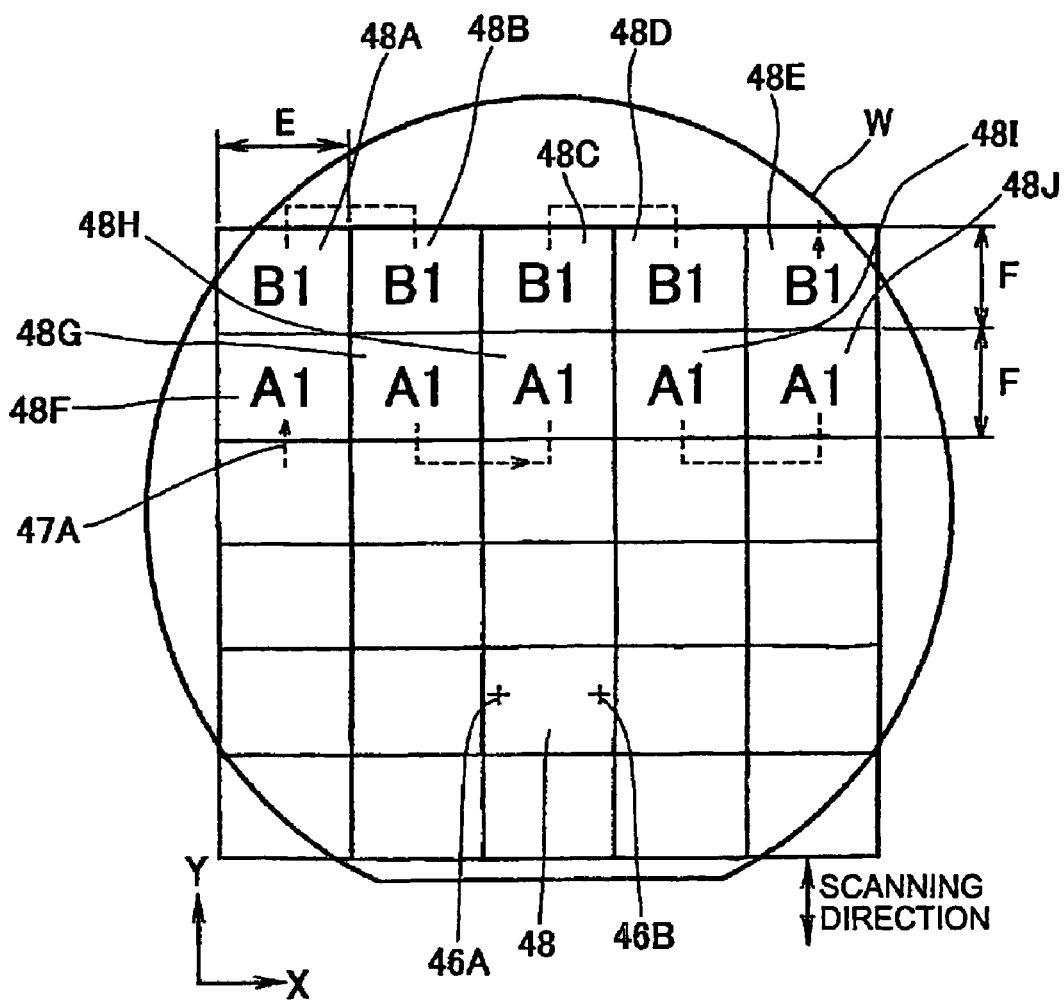
FIG. 8 is a plan view showing an example of shot arrangements on the wafer in the first embodiment.

FIG. 8 shows a shot arrangement on the wafer W in this example. In FIG. 8, a number of shot regions (representatively illustrated by shot regions 48) are formed on the wafer W with a predetermined pitch in X and Y directions. Each of these shot regions 48 is a rectangular region having a width F in the Y direction (scanning direction) and a width E in the X direction while including an region extending to the centers of the street lines in the boundary portions with respect to its adjacent shot regions in X and Y directions. The respective images of patterns A and B of the first and second pattern regions RA and RB in FIG. 4(a) are double-exposed to each of the shot regions 48. The shot region 48 is provided with two alignment marks 46A, 46B, for example. When the coordinates of alignment marks 46A, 46B within a predetermined number of shot regions 48 selected from the wafer W are measured by a wafer alignment sensor 37W and subjected to statistical processing, the shot regions on the wafer W can be aligned by an enhanced global alignment scheme, for example.

Operations of double-exposing the images of patterns A, B in two pattern regions RA, RB in the reticle R in FIG. 4(a) onto the wafer W in the shot arrangement shown in FIG. 8 will now be explained with reference to FIGS. 4 to 7 as well. FIGS. 4(a) to (l) are views showing respective positional relationships between a plurality of pattern regions RA, RB and two illumination regions 25A, 25B at the time of scanning exposure. Though the reticle R is scanned in ±Y directions with respect to the illumination regions 25A, 25B in practice, FIGS. 4(a) to (l) are illustrated such that the illumination regions 25A, 25B relatively move in the Y direction on the reticle R for convenience of explanation.

FIGS. 5(a) to (d) show respective states of the aperture of the movable blind 18A (regulated by the blinds 18A1, 18A2) and the aperture of the movable blind 18B (regulated by the blinds 18B1, 18B2) in the cases of FIGS. 4(a) to (d). FIGS. 6(e) to (h) show respective states of the apertures of the movable blinds 18A and 18B in the cases of FIGS. 4(e) to (h). FIGS. 7(i) to (l) show respective states of the apertures of the movable blinds 18A and 18B in the cases of FIGS. 4(i) to (l).

[First Block]

First, an image B1 of the pattern B in the pattern region RB and an image A1 of the pattern A in the pattern region RA in FIG. 4(a) are exposed to two shot regions 48A and 48F adjacent to each other in the Y direction on the wafer W of FIG. 8 by one scan, respectively. The patterns A and B on the reticle R in FIG. 4(a) are thus in reverse order from the images A1 and B1 of patterns A and B on the wafer W in FIG. 8 in the Y direction, since the projection optical system PL of this example forms an inverted image. When both of the illumination regions 25A, 25B are closed as in FIG. 4(a), both of the movable blinds 18A, 18B are closed as shown in FIG. 5(a).

Scanning of the reticle R with respect to the illumination fields 18AP, 18BP within the field of the projection optical system PL in FIG. 3 in the +Y direction is assumed to start from the state of FIG. 4(a). In synchronization therewith, the wafer W of FIG. 8 is scanned in the −Y direction with respect to the exposure region (region optically conjugate with the illumination regions 25A, 25B) of the projection optical system PL. In FIG. 8, the relative locus 47A of the exposure region with respect to the reticle R is illustrated by a broken line. Here, the wafer W is driven in synchronization such that the shot regions 48F and 48A are overlaid on the images of the pattern regions RA and RB on the reticle R, respectively. At the time of scanning exposure, the apertures of the movable blinds 18A and 18B are regulated to open and close according to the position of the reticle R in the Y direction in FIG. 2 such that the illumination regions 25A and 25B illuminate only the patterns within the pattern regions RB and RA (see FIG. 4(a)) surrounded by the light-shielding bands 51 and 53 of the reticle R within the illumination fields 18AP and 18BP, respectively.

At the time when the pattern region RA of the reticle R enters the illumination field 18BP in FIG. 3, the second illumination region 25B initially starts to open as shown in FIG. 4(b) (the movable blind 18B begins to open in FIG. 5(b) corresponding thereto). The second illumination region 25B fully opens in the state corresponding to FIG. 4(c) (the movable blind 18B fully opens as in FIG. 5(c) corresponding thereto). Subsequently, when only the pattern region RA passes the illumination field 18BP in FIG. 3, the reticle R is scanned with respect to the second illumination region 25B as in FIGS. 4(d) and 4(e) (only the movable blind 18B is fully open in FIGS. 5(d) and 6(e) corresponding thereto). As a consequence, only the image A1 of the pattern in the first pattern region RA in the reticle R is sequentially exposed to the shot region 48F of the wafer W in FIG. 8.

[Second Block]

Next, while the pattern region RA of the reticle R is illuminated with the second illumination region 25B as shown in FIG. 4(f), the first illumination region 25A starts to open (the movable blind 18A begins to open in FIG. 6(f) corresponding thereto) at the time when the pattern region RB enters the illumination field 18AP in FIG. 3. The first illumination region 25A fully opens in FIG. 4(g) (the movable blind 18A fully opens as in FIG. 6(g) corresponding thereto). In this state, both of the illumination regions 25A and 25B are fully open, the light-shielding band 53 is located at their boundary portion, and the images A1 and B1 of patterns in the pattern regions RA and RB in the reticle R are partly exposed the adjacent shot regions 48F and 48A in parallel on the wafer W in FIG. 8. When the reticle R is further scanned in the +Y direction thereafter, the second illumination region 25B is gradually closed so as to follow the light-shielding band 53 as shown in FIG. 4(h) (the movable blind 18B gradually closes as shown in FIG. 6(h) corresponding thereto). In FIG. 4(i), the second illumination region 25B is completely closed, whereby only the second pattern region RB of the reticle R is illuminated with the first illumination region 25A (the movable blind 18B is completely closed as shown in FIG. 7(i) corresponding thereto). As a result, the exposure to the shot region 48F on the wafer W in FIG. 8 ends, whereas the exposure to only the adjacent shot region 48A continues.

[Third Block]

Since the second pattern region RB of the reticle R is located within the illumination field 18AP in FIG. 3 while the first pattern region RA is outside of the illumination field 18BP in this state, only the second pattern region RB of the reticle R is illuminated with the fully open first illumination region 25A as shown in FIGS. 4(j) and 4(k) (only the movable blind 18A is fully open as shown in FIGS. 7(j) and 7(k) corresponding thereto), whereas the image B1 of the pattern in the second pattern region RB is sequentially exposed to the shot region 48A of the wafer W in FIG. 8. Thereafter, when the light-shielding band 51 of the reticle R reaches the first illumination region 25A as shown in FIG. 4(l), the width of the first illumination region 25A gradually becomes 0 (the movable blind 18A gradually closes as shown in FIG. 7(l) corresponding thereto), whereby the exposure of the image B1 corresponding to the shot region 48A of FIG. 8 ends. When the reticle R having two pattern regions RA, RB are scanned only once in the Y direction with respect to the illumination regions 25A, 25B for exposure, pattern images are exposed to the two shot regions 48A, 48F adjacent to each other on the wafer W. Here, the exposure to the shot regions 48A and 48F is performed by dipole illumination in directions orthogonal to each other.

[Fourth Block]

Next, subsequently to the state of FIG. 4(*l*), the reticle R is moved to a scanning start position in the +Y direction with respect to the illumination fields 18AP, 18BP in FIG. 3. The wafer W is moved stepwise in the X direction by the width E of one shot region 48 in the X direction in FIG. 8. Thereafter, while moving the wafer W in the +Y direction in synchronization with moving the reticle R in the −Y direction, the illumination regions 25A, 25B are driven successively from FIG. 4(*l*) to FIG. 4(*a*), whereby the images B1 and A1 of the patterns within the pattern regions RB and RA in the reticle R are respectively exposed to the shot regions 48B and 48G adjacent to each other in the Y direction on the wafer W in FIG. 8. Subsequently, the reticle R is alternately scanned in the +Y and −Y directions, the wafer W is driven in synchronization therewith so that the exposure region relatively moves along the locus 47A in FIG. 8, and the illumination regions 25A, 25B are regulated to be opened and closed as shown in FIGS. 4(*a*) to (*l*), whereby the image B1 is exposed to a series of shot regions 48A to 48E in the X direction, whereas the image A1 is exposed to a series of shot regions 48F to 48J in the X direction on the wafer W in FIG. 8.

[Fifth Block]

Figure 9:
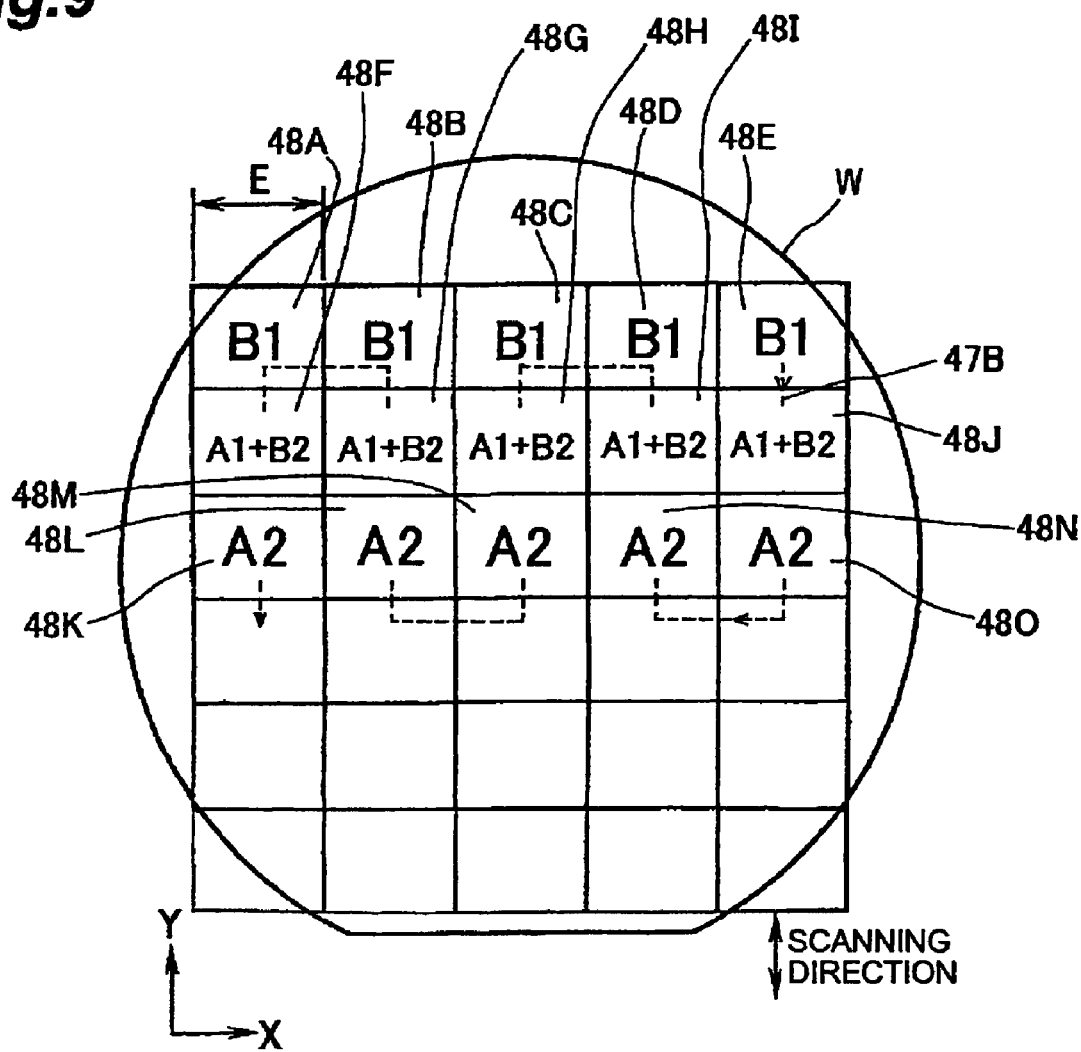
FIG. 9 is a plan view used for explaining a case where exposure is performed in the shot regions on the second and third lines on the wafer of FIG. 8.
Figure 10:
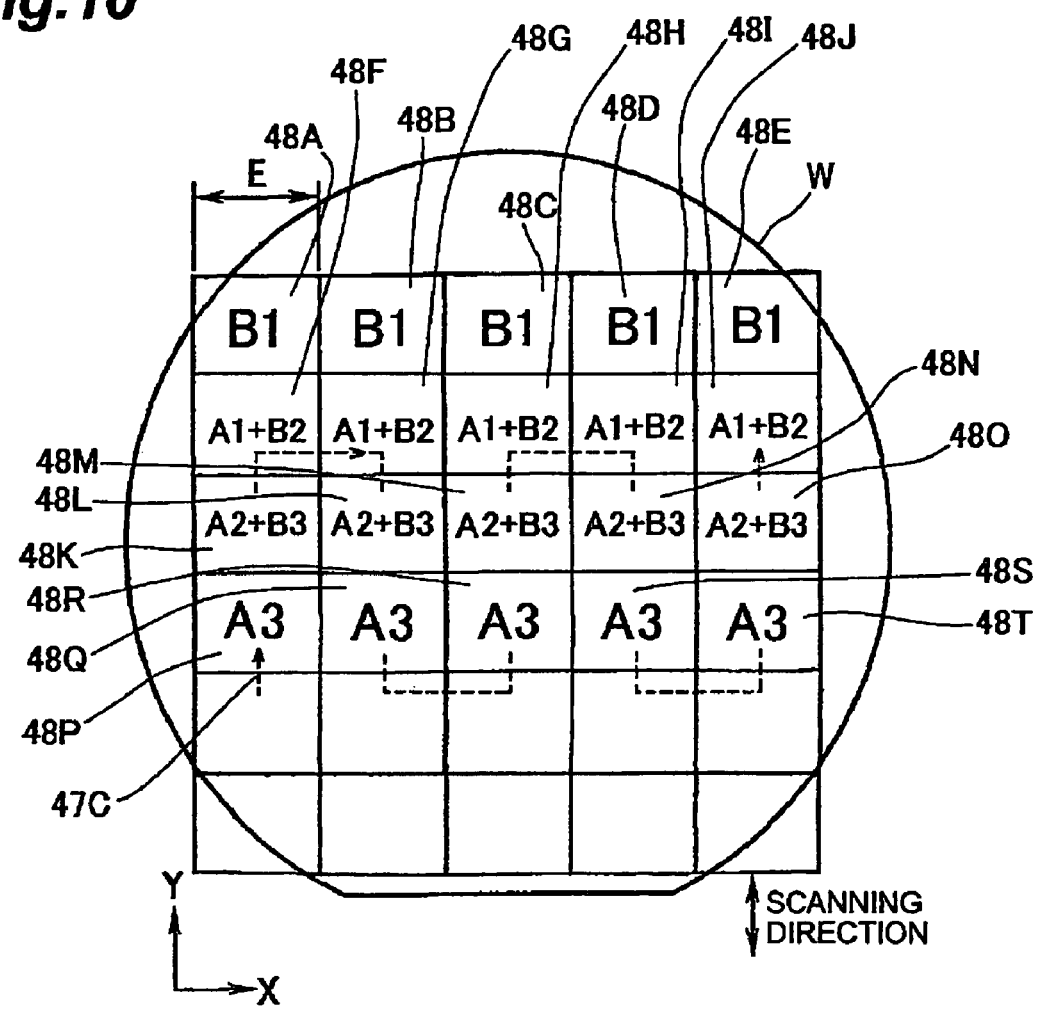
FIG. 10 is a plan view used for explaining a case where exposure is performed in the shot regions on the third and fourth lines on the wafer of FIG. 8.

Next after moving the wafer W in FIG. 8 stepwise in the −Y direction by the width F of one shot region 48 in the Y direction, the above-mentioned first to third blocks are performed for the shot regions 48J and 48O adjacent to each other in the Y direction on the wafer W in FIG. 9 (in the opposite scanning direction), whereby images B2 and A2 of patterns in the pattern regions RB and RA of the reticle R in FIG. 4(*a*) are exposed to the shot regions 48J and 48O, respectively, by one scanning exposure. As a consequence, the image B2 of the pattern in the second pattern region RB and the image A1 of the pattern in the first pattern region RA in the reticle R are double-exposed onto the shot region 48J.

Subsequently, as in the above-mentioned fourth block, the reticle R is alternately scanned in the +Y and −Y directions, the wafer W is driven in synchronization therewith so that the exposure region relatively moves along a locus 47B in FIG. 9, and the illumination regions 25A, 25B are regulated to be opened and closed as shown in FIGS. 4(*a*) to (*l*), whereby the image B2 is exposed to a series of shot regions 48J to 48F in the X direction, whereas the image A2 is exposed to a series of shot regions 48O to 48K on the third line in the X direction on the wafer W in FIG. 9. The images A1 and B2 are double-exposed to each of a series of shot regions 48F to 48J on the second line in the X direction.

[Sixth Block]

Next, the wafer W in FIG. 9 is moved stepwise in the −Y direction by the width F of one shot region 48 (see FIG. 8) in the Y direction. Thereafter, the reticle R is alternately scanned in the +Y and −Y directions, the wafer W is driven in synchronization therewith so that the exposure region relatively moves along a locus 47C in FIG. 10, and the illumination regions 25A, 25B are regulated to be opened and closed as shown in FIGS. 4(*a*) to (*l*), whereby an image B3 of the pattern in the second pattern region RB in the reticle R is exposed to a series of shot regions 48K to 48O in the X direction on the wafer W in FIG. 10, whereas an image A3 of the pattern in the first pattern region RA is exposed to a series of shot regions 48P to 48T in the X direction. As a result, the images A2 and B3 are double-exposed to each of a series of shot regions 48K to 48T on the third line in the X direction.

Repeating this operation double-exposes images of patterns of the first and second pattern regions RA and RB to all the shot regions excluding those at end portions in the +Y directions on the wafer W. This terminates the operation of the sixth block.

Since the exposure to two shot regions adjacent to each other in the scanning direction on the wafer W is effected by one scan at that time, the double exposure can be performed at a very high throughput Though an image of the pattern in the pattern region RA or RB in the reticle R is required to be separately exposed alone to the shot regions at end portions in the Y direction on the wafer W for realizing double-exposure there, the number of shot regions on the wafer W in practice is much greater than those arranged in FIG. 8, whereby the throughput hardly decreases.

In order to adjust the widths of a plurality of illumination regions 25A, 25B in the scanning direction, so that the illumination regions 25A, 25B fall within the respective pattern regions RA, RB, this example thus can position the illumination regions 25A, 25B adjacent to each other in the scanning direction while independently regulating the movable blinds 18A, 18B in synchronization with the position of the reticle R in the scanning direction. This allows exposure light under different illumination conditions (illumination scheme, polarized illumination, illuminance, etc.) to be supplied to entire regions of a plurality of pattern regions RA, RB along the scanning direction on the reticle R. Therefore, entire surface of each of a plurality of pattern regions on the reticle R can be illuminated under its optimized illumination conditions, whereby a high imaging characteristic (resolution or the like) can be obtained in projected images after the double exposure. Hence, the line width controllability and the like of finally formed circuit patterns are excellent, whereby semiconductor devices and the like can be manufactured with a high precision.

The structure, operations, and the like of the projection exposure apparatus in accordance with this embodiment will be summarized as follows:

A1) The illumination optical system IU of FIG. 1 comprises the secondary relay optical system 22, arranged between the exposure light source 10 and the reticle surface (the pattern surface of the reticle R), for forming the reticle conjugate plane 62 optically conjugate with the reticle surface between the exposure light source 10 and the reticle surface; and the optical path combining mirror 21, arranged between the exposure light source 10 and the reticle surface, for combining the first exposure light beam IL1 and second exposure light beam IL2 from the exposure light source such that they illuminate the reticle surface closely to each other; wherein the optical path combining mirror 21 includes a first reflecting surface 21*a* for reflecting the first exposure light beam IL1 and a second reflecting surface 21, separated from the first reflecting surface 21*a*, for reflecting the second exposure light beam IL2, while the ridge line 21*c* at the boundary between the reflecting surfaces 21*a* and 21*b* is arranged on the reticle conjugate plane 62. It will be sufficient if the ridge line 21*c* is arranged near the reticle conjugate plane 62 as mentioned above. The projection exposure apparatus of this example comprises the illumination optical system IU.

As a result, the illumination regions of exposure light beams IL1 and IL2 are clearly separated from each other on the reticle surface by the image of the ridge line 21*c* of the optical path combining mirror 21. This makes it possible to illuminate the adjacent two pattern regions RA, RB of the reticle R on the reticle surface individually with the exposure light beams IL1 and IL2. Independently optimizing illumination conditions of the exposure light beams IL1 and IL2 allows entire regions of the patterns in the pattern regions RA, RB to be illuminated under their optimal illumination conditions, respectively.

A2) This example employs one exposure light source 10 of FIG. 1 and comprises the optical divider 11 for dividing the exposure light IL from the exposure light source 10 into two exposure light beams IL1 and IL2. Therefore, one exposure light source is sufficient for use, whereby the cost of manufacturing a projection exposure apparatus can be suppressed.

A3) The exposure light beams IL1 and IL2 may be introduced from different exposure light sources without using the optical divider 11 of FIG. 1. This makes it possible to perform energy control per pulse or the like, for example, for each of the exposure light beams IL1 and IL2, thereby widening the range of kinds of illumination conditions which are independently controllable for individual pattern regions.

A4) Since the exposure light beams IL1 and IL2 are respectively incident on the reflecting surfaces 21a and 21b of the optical path combining mirror 21 in FIG. 1, optical systems (illumination units IUA, IUB, etc.) for the exposure light beams IL1 and IL2 can be arranged symmetrical. Therefore, the illumination optical system IU can be designed and adjusted easily.

A5) However, as is also illustrated in a modified example which will be explained later, an optical path assembling member which reflects only one of the exposure light beams IL1 and IL2 and transmits therethrough the other as it is can also be used in place of the optical path combining mirror 21.

A6) As is also illustrated in a modified example which will be explained later, an optical path assembling member in which a surface transmitting at least one of the exposure light beams IL1 and IL2 is a refracting surface can also be used in place of the optical path combining mirror 21. When both are refracting surfaces, the optical systems for the exposure light beams IL1 and IL2 can be arranged symmetrical in particular.

An optical path assembling member in which a surface transmitting at least one of the exposure light beams IL1 and IL2 is a surface combining a reflecting surface and a refracting surface can also be used in place of the optical path combining mirror 21.

A7) Since the illumination optical system IU of FIG. 1 comprises the first movable blind 18A positioned in an optical path of the first exposure light beam IL1 and the second movable blind 18B positioned in an optical path of the second exposure light beam IL2, regulating the movable blinds 18A and 18B can easily set the illumination regions formed by the first exposure light beam IL1 and second exposure light beam IL2 on the reticle surface independently from each other with a high precision.

A8) The illumination optical system IU of FIG. 1 comprises the first primary relay optical system 19A arranged in an optical path between the first movable blind 18A and the reticle conjugate plane 62, and the second primary relay optical system 19B arranged in an optical path between the second movable blind 18B and the reticle conjugate plane 62. Therefore, images of the apertures of the movable blinds 18A and 18B (illumination regions) can easily be arranged close to each other on the reticle conjugate plane 62, whereby the patterns within the pattern regions RA and RB arranged close to each other on the reticle R can be illuminated under different illumination conditions.

A9) The illumination optical system IU of FIG. 1 comprises the first and second illumination units IUA and IUB for supplying the exposure light beams IL1 and IL2 to the first and second movable blinds 18A and 18B, respectively, the first illumination unit IUA and the first primary relay optical system 19A are arranged coaxially, and the second illumination unit IUB and the second primary relay optical system 19B are arranged coaxially, whereby the optical systems can be arranged easily.

A10) However, as is also illustrated in a modified example which will be explained later, the first illumination unit IUA and the first primary relay optical system 19A can be arranged non-coaxially, and the second illumination unit IUB and the second primary relay optical system 19B can be arranged non-coaxially.

A11) From a different viewpoint the illumination optical system IU of FIG. 1 in this embodiment comprises the optical path combining mirror 21, arranged between the exposure light source 10 and the reticle surface, for combining a plurality of exposure light beams IL1, IL2 different from each other from the exposure light source 10 such that they illuminate the reticle surface closely to each other; wherein the optical path combining mirror 21 comprises the ridge line 21c, positioned on or near the reticle conjugate plane 62, for making the two reflecting surfaces 21a, 21b discontinuous; and wherein the plurality of exposure light beams IL1, IL2 travel by way of a plurality of reflecting surfaces 21a, 21b sectioned by the ridge line 21c. The projection exposure apparatus of this example comprises the illumination optical system IU.

As a result, the illumination regions of the exposure light beams IL1, IL2 are clearly separated by an image of the ridge line 21c of the optical path combining mirror 21. This makes it possible to illuminate the adjacent two pattern regions RA, RB of the reticle R on the reticle surface individually with the exposure light beams IL1 and IL2, and optimize illumination conditions of the exposure light beams IL1 and IL2 independently of each other.

A12) The ridge line 21c of the optical path combining mirror 21 is straight, the image of the ridge line 21c on the reticle surface is also straight, and a plurality of pattern regions sectioned by the straight line on the reticle surface can be illuminated under their optimal illumination conditions.

First Modified Example of First Embodiment

Figure 11:
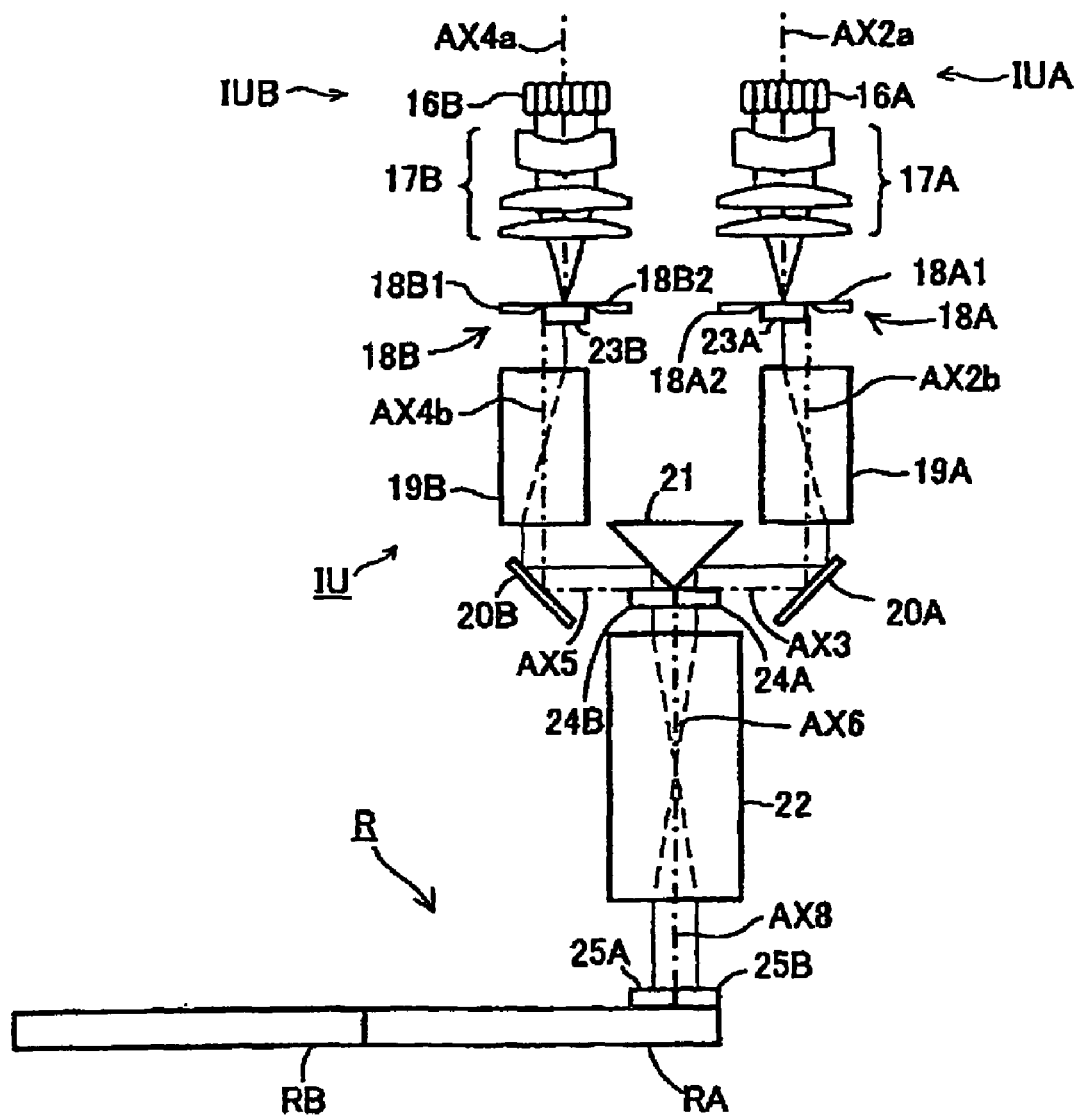
FIG. 11 is a view showing a main part of the illumination optical system in the first modified example of the first embodiment.

FIG. 11 shows a main part of the illumination optical system in accordance with a first modified example of the first embodiment This modified example in FIG. 11, in which parts corresponding to those of FIGS. 1 and 2 are referred to with the same numerals, differs from the first embodiment in that optical axes AX2a and AX4a of illumination units IUA and IUB respectively supplying exposure light to the movable blinds 18A and 18B are positioned so as to become the respective centers of the fully opened apertures (illumination regions 23A and 23B) of their corresponding movable blinds 18A and 18B. Namely, in this modified example, the optical axes AX2b and AX4b of the primary relay optical systems IUA and IUB and the optical axes AX2a and AX4a of the illumination units IUA and IUB are not coaxial but deviate from each other in a direction corresponding to the scanning direction of the reticle R. This structure makes it possible to use an illumination unit such that a conventional movable blind as a whole is employed in one illumination optical system as the illumination units IUA and IUB.

Second Modified Example of First Embodiment

Figure 12:
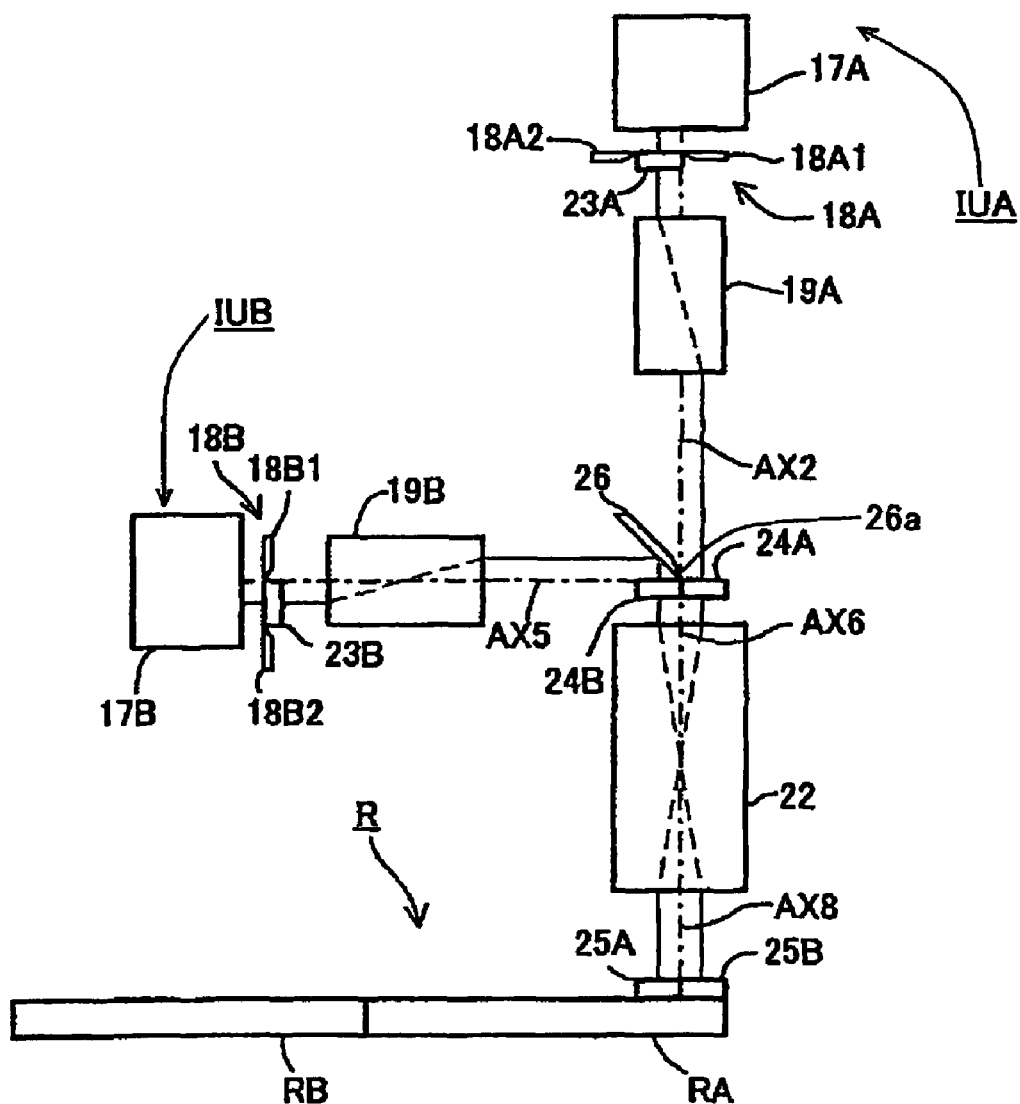
FIG. 12 is a view showing a main part of the illumination optical system in the second modified example of the first embodiment.

FIG. 12 shows a main part of the illumination optical system in accordance with a second modified example of the first embodiment. This modified example in FIG. 12, in which parts corresponding to those of FIGS. 1 and 2 are referred to with the same numerals, differs from the first embodiment in that an optical path combiner 26 is provided in place of the optical path combining mirror 21 having two reflecting surfaces 21a, 21b orthogonal to each other in FIG. 1. Here, the optical path combiner 26 has a reflecting surface tilted such as to form an angle of 45° with the optical axis AX5 of the second primary relay optical system 19B, deflects the light beam from the primary relay optical system 19B by 90°, and guides thus deflected light beam to the secondary relay optical system 22. On the other hand, the light beam exited from the first primary relay optical system 19A advances straight through an optical path outside of an effective region of the optical path combiner 26 toward the secondary relay optical system 22. Here, an edge 26a of the reflecting surface of the optical path combiner 26 is positioned at a point where the optical axis AX2 of the primary relay optical system 19A, the optical axis AX5 of the primary relay optical system 19B, and the optical axis AX6 of the secondary relay optical system 22 intersect. This intersection is positioned on a surface optically conjugate with the reticle surface (the pattern surface of the reticle R) about the secondary relay optical system 22. The structure of the optical path combiner 26 is simple in this modified example.

Third Modified Example of First Embodiment

Figure 13:
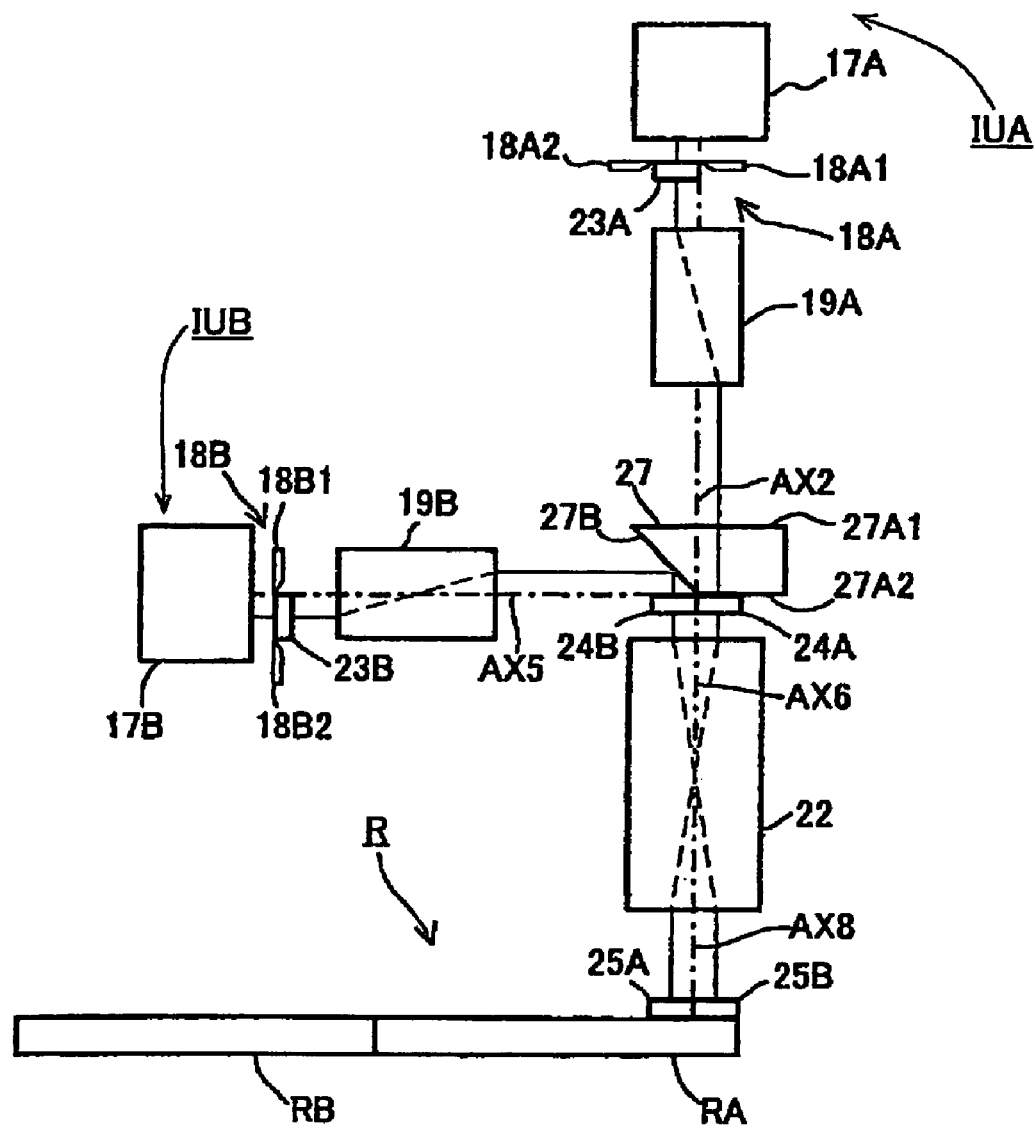
FIG. 13 is a view showing a main part of the illumination optical system in the third modified example of the first embodiment.

FIG. 13 shows a main part of the illumination optical system in accordance with a third modified example of the first embodiment. This modified example in FIG. 13, in which parts corresponding to those of FIG. 12 are referred to with the same numerals, is provided with an optical path combiner 27 made of a trapezoidal light-transmitting prism member having a reflecting surface in a part thereof in place of the optical path combiner 26 shown in the second modified example in FIG. 12. This optical path combiner 27 comprises an entrance surface 27A1 on which the light beam from the primary relay optical system 19A is incident, an exit surface 27A2 from which the light beam coming by way of the entrance surface 27A1 exits, and a reflecting surface 27B deflecting the light beam from the primary relay optical system 19B by 90°. Here, the entrance surface 27A1 and exit surface 27A2 are provided parallel to each other, whereas the reflecting surface 27B is tilted so as to form an angle of 45° with the optical axis AX5 of the primary relay optical system 19B. An edge of the reflecting surface 27B is positioned on a surface optically conjugate with the reticle surface about the secondary relay optical system 22 in the optical path combiner 27 of this modified example as well. The exit surface 27A2 of the optical path combiner 27 is also positioned on a surface optically conjugate with the reticle surface about the secondary relay optical system 22.

Fourth Modified Example of First Embodiment

Figure 14:
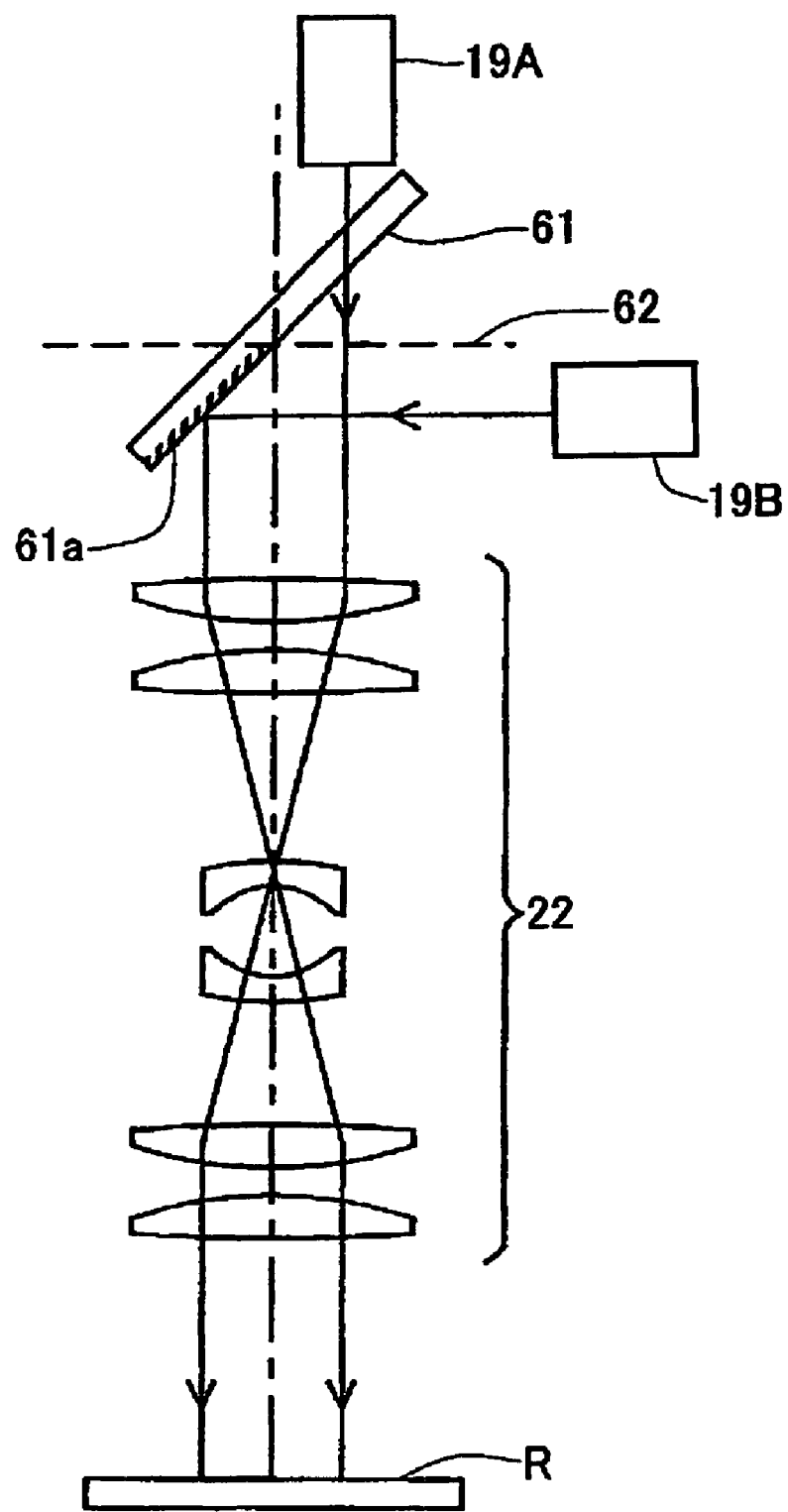
FIG. 14 is a view showing a main part of the illumination optical system in the fourth modified example of the first embodiment.

FIG. 14 shows a main part of the illumination optical system in accordance with a fourth modified example of the first embodiment. This modified example in FIG. 14, in which parts corresponding to those of FIG. 12 are referred to with the same numerals, employs an optical path combiner 61 in which a partly reflecting surface 61a made of a reflecting film (e.g., aluminum vapor deposition film) is partly provided on a plane parallel plate tilted by 45° with respect to the optical axes of the primary relay optical systems 19A and 19B in place of the optical path combiner 26 shown in the second modified example of FIG. 12. In this case, the light beam from the primary relay optical system 19A is transmitted through a transmitting part of the optical path combiner 61, so as to be made incident on the secondary relay optical system 22, whereas the light beam from the primary relay optical system 19B is deflected by 90° at the partly reflecting surface 61a of the optical path combiner 61, so as to be made incident on the secondary relay optical system 22. The structure of the optical path combiner 61 in this modified example is also simple.

Fifth Modified Example of First Embodiment

Figure 15:
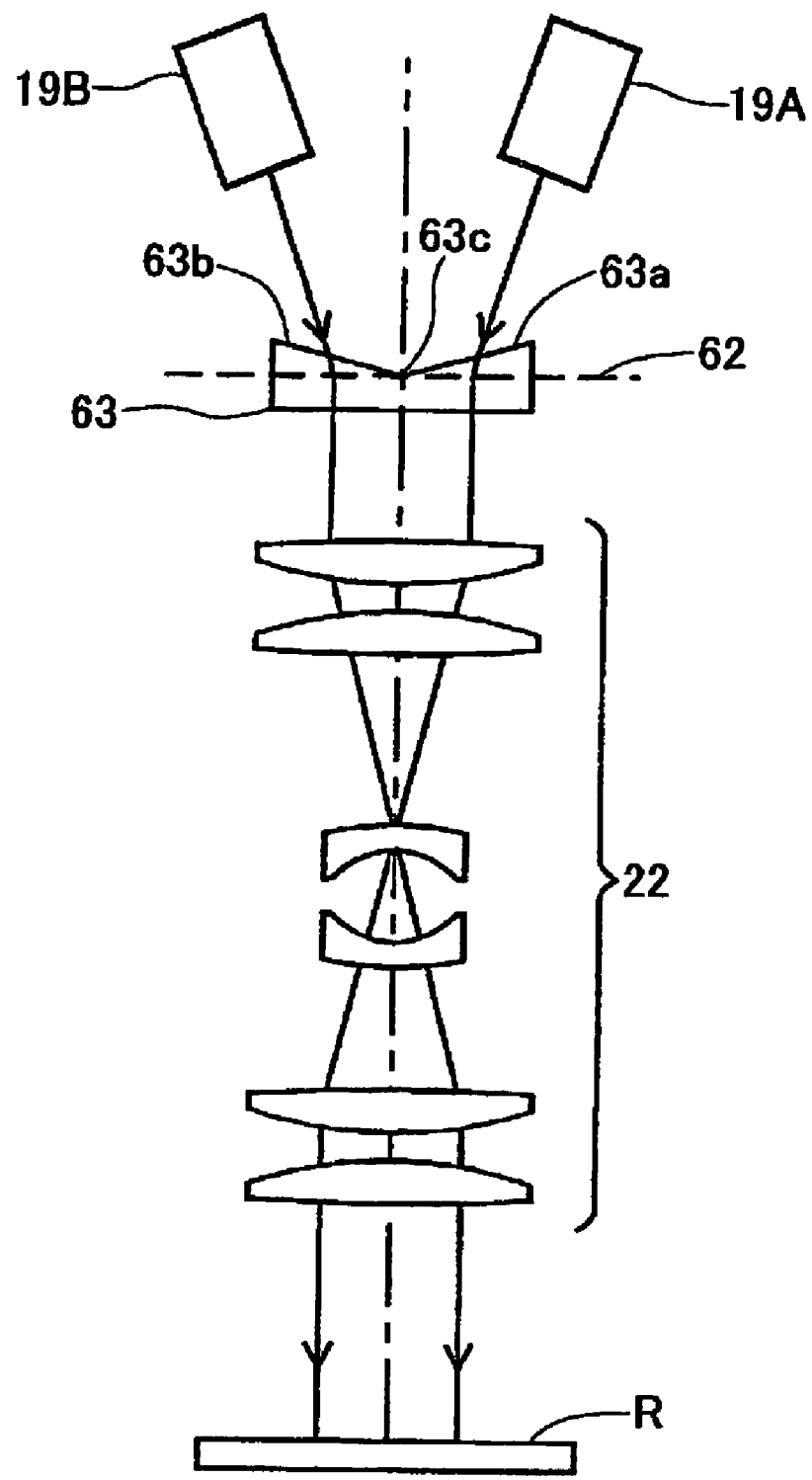
FIG. 15 is a view showing a main part of the illumination optical system in the fifth modified example of the first embodiment.

FIG. 15 shows a main part of the illumination optical system in accordance with a fifth modified example of the first embodiment. This modified example in FIG. 15, in which parts corresponding to those of FIGS. 1 and 2 are referred to with the same numerals, employs an optical path combiner 63 constituted by a one-dimensional prism array having refracting surfaces 63a and 63b symmetrically tilted so as to hold a boundary line 63c between the refracting surfaces 63a, 63b in place of the optical path combining mirror 21 shown in the first embodiment of FIG. 1. In this modified example, the optical axis of the first optical system constituted by the primary relay optical system 19A, the movable blind 18A in FIG. 1 in front thereof, and the illumination unit IUA, and the optical axis of the second optical system constituted by the primary relay optical system 19B, the movable blind 18B in FIG. 1 in front thereof and the illumination unit IUB are tilted symmetrically such that the respective optical axes refracted by the refracting surfaces 63a and 63b of the optical path combiner 63 in FIG. 15 are parallel to the optical axis of the secondary relay optical system 22. Namely, the respective light beams from the primary relay optical systems 19A and 19B are incident on the refracting surfaces 63a and 63b of the optical path combiner 63 and assembled coaxially. In this case, the straight boundary line 63c making the refracting surfaces 63a and 63b of the optical path combiner 63 discontinuous is positioned on the reticle plane 62 or a surface in the vicinity thereof. As a consequence, different pattern regions can reliably be illuminated with light beams from the primary relay optical systems 19A and 19B on the reticle surface. This modified example makes it possible to omit the optical path folding mirrors 20A, 20B in the example of FIG. 1, thereby simplifying the structure of the illumination optical system.

Sixth Modified Example of First Embodiment

Figure 16:
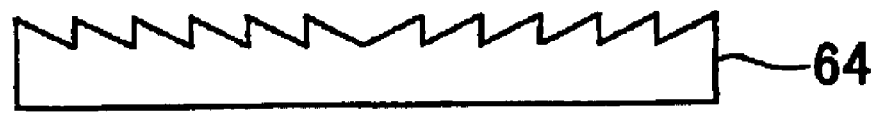
FIG. 16 is a view showing an optical member usable in place of the optical path combiner 63 in the embodiment of FIG. 15.

A one-dimensional refracting member 54 of Fresnel zone plate type or phase grating type shown in FIG. 16 may be used in place of the optical path combiner 63 in FIG. 15.

Second Embodiment

A second embodiment of the present invention will now be explained with reference to FIGS. 17 to 20. This example also employs the embodiment when carrying out exposure by using a projection exposure apparatus of scanning stepper type. In FIGS. 17 to 20, parts corresponding to those in FIGS. 1 to 11 are referred to with the same numerals without repeating their detailed explanations. This example differs from the first embodiment in that a plurality of reticles arranged in the scanning direction are used instead of providing a plurality of pattern regions (patterns) on a single reticle. Though the plurality of reticles are provided with a predetermined interval in the scanning direction, the interval of a plural of shot regions on their corresponding wafer is a narrow straight street line region as in the first embodiment, whereby an image shifter is provided in the projection optical system in this example.

Figure 17:
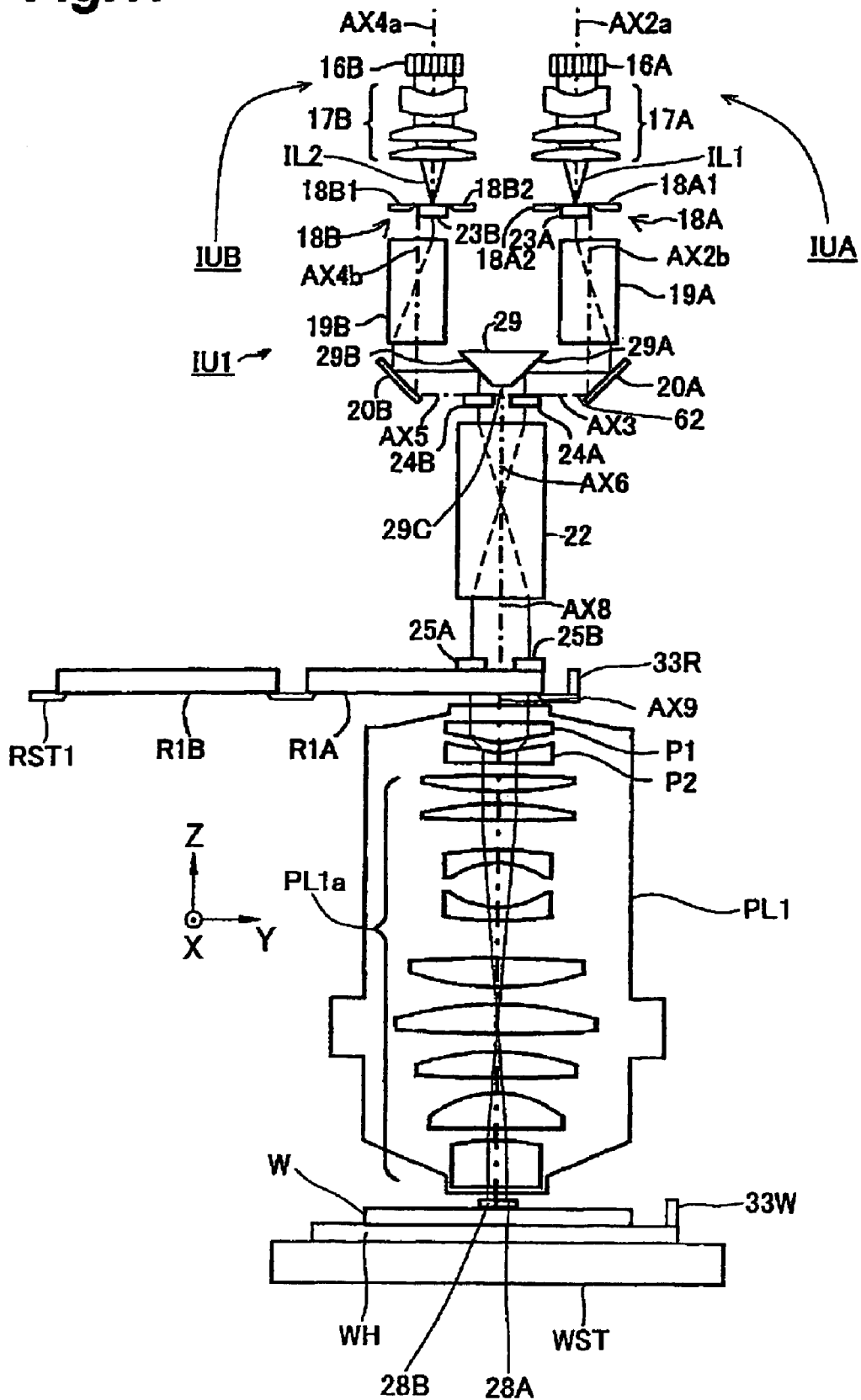
FIG. 17 is a view showing a schematic structure of the projection exposure apparatus in accordance with the second embodiment of the present invention.
Figure 18:
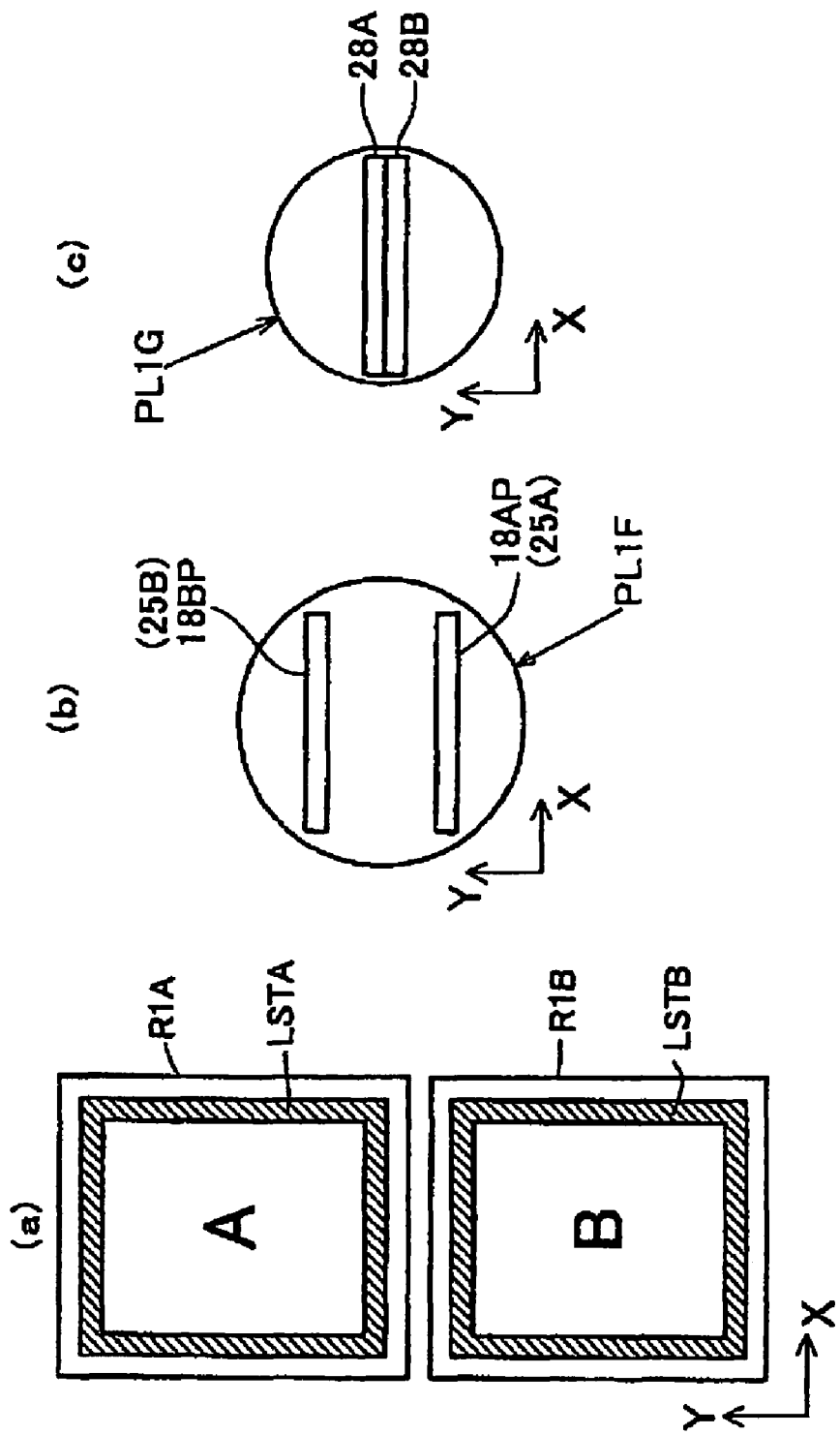
FIG. 18 is a plan view showing the relationship between reticles, the field in the projection optical system PL1, illumination fields, the image field in the projection optical system PL1 and exposure regions in FIG. 17 ((a) is a plan view showing two reticles of FIG. 17; (b) is a plan view showing the relationship between the field in the projection optical system PL1 of FIG. 17 and illumination fields; and (c) is a plan view showing the relationship between the image field in the projection optical system PL1 of FIG. 17 and exposure regions).
Figure 19:
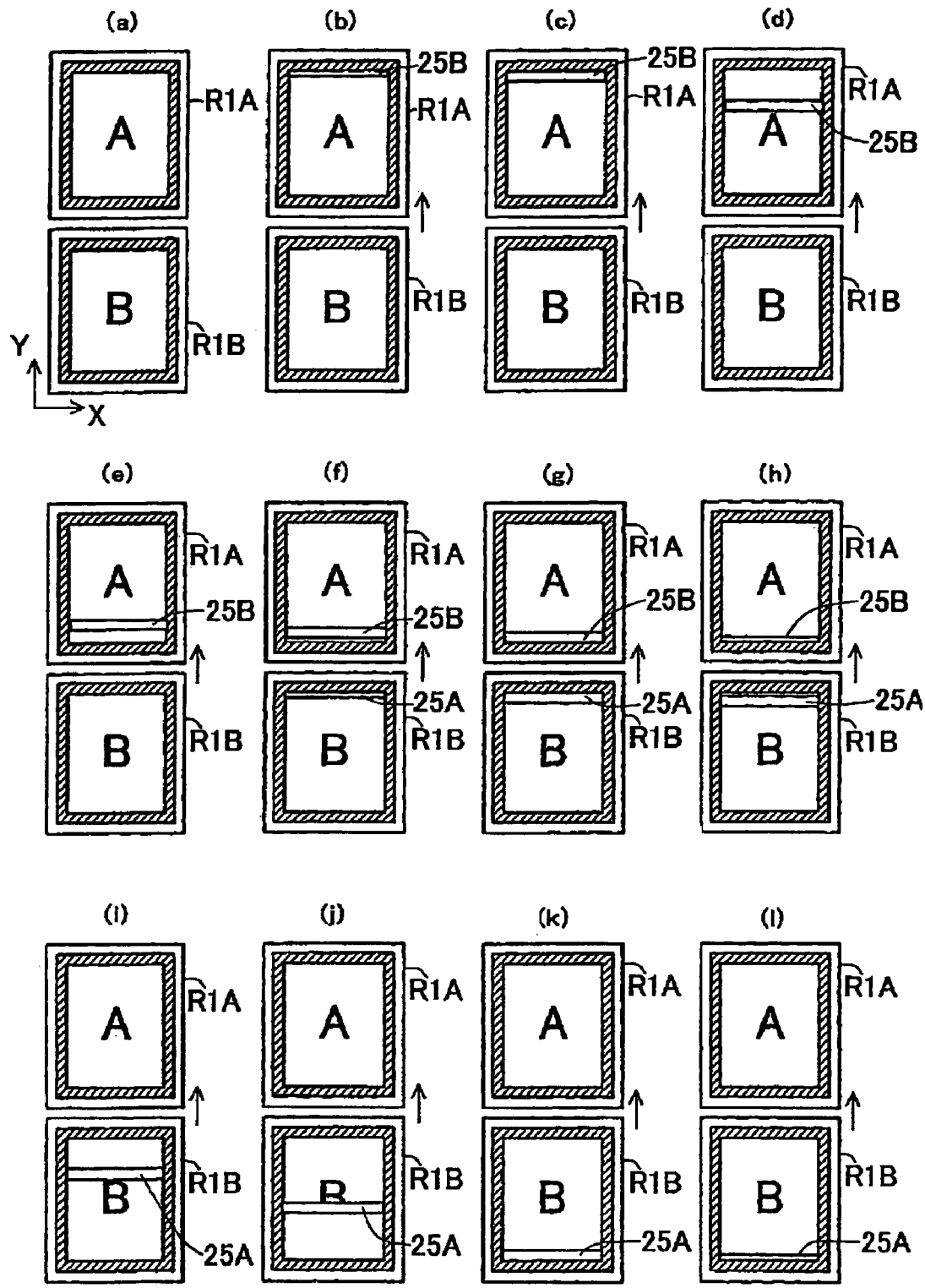
FIG. 19 is a view showing an example of changes in the positional relationship between pattern regions of two reticles in FIG. 17 and the illumination regions 25A, 25B.
Figure 20:
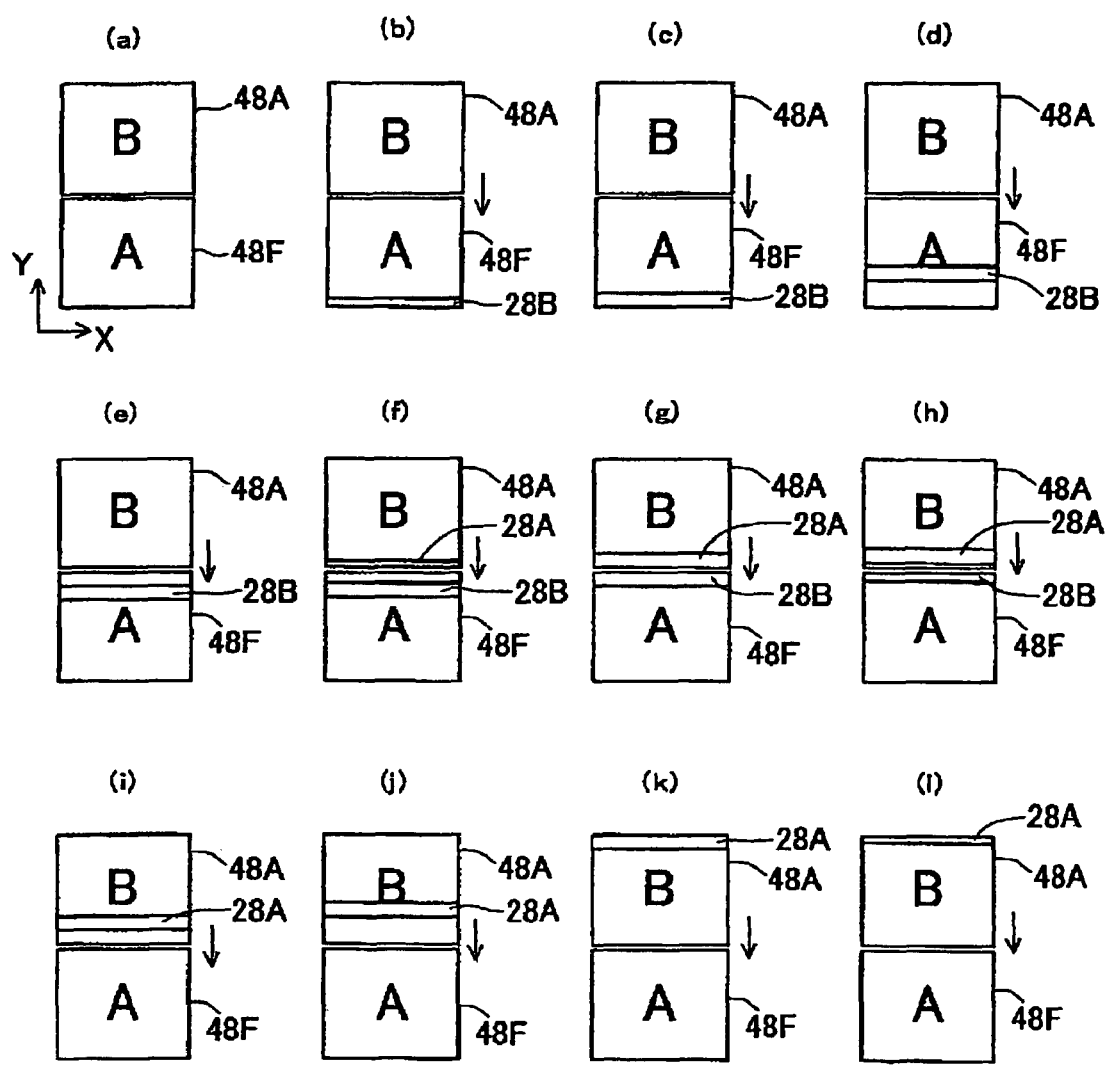
FIG. 20 is a view showing an example of changes in the positional relationship between two adjacent shot regions and the exposure regions 28A, 28B corresponding to the change in the state of FIG. 19.

FIG. 17 shows a main part of the projection exposure apparatus in this example. In FIG. 17, this projection exposure apparatus comprises an exposure light source (not depicted); an illumination optical system IU1 for illuminating a plurality of (2 here) reticles R1A, R1B with illumination regions 25B and 25A under illumination conditions independent of each other by two exposure light beams IL1, IL2 obtained by dividing exposure light emitted from the exposure light source; a reticle stage RST1 which holds the reticles R1A, R1B at a predetermined interval in the Y direction (scanning direction) by suction through respective micromotion stages (not depicted) and moves in the Y direction on a reticle base (not depicted); a projection optical system PL1 which projects images of patterns within the illumination regions 25B, 25A of the reticles R1A, R1B to exposure regions 28B, 28A on a wafer W under reduction; a wafer stage WST which holds the wafer W by suction through a wafer holder WH and moves in the X and Y directions; and a control system (not depicted) similar to the main control system 36 and stage driving system 35 in FIG. 1. In this case, the micromotion stages on the reticle stage RST1 can independently adjust the positions of their corresponding reticles R1A, R1B in the X, Y, and Z directions and angles of rotation thereof about the X, Y, and Z axes.

FIG. 18(a) shows the reticles R1A and R1B on the reticle stage RST1 in FIG. 17, whereas patterns A and B are formed in pattern regions surrounded by light-shielding bands LSTA and LSTB of the reticles R1A and R1B, respectively. In practice, the patterns A and B are constituted by the Y-direction L&S pattern 55Y and X-direction L&S pattern 55X, respectively, by way of example as shown in FIG. 4(a). Therefore, dipole illuminations in the Y and X directions are used as illumination schemes for the patterns A and B, respectively.

Returning to FIG. 17, while the optical axes AX2a, AX4 of illumination units IUA, IUB and the optical axes AX2b, AX4b of primary relay optical systems 19A, 19B are arranged non-coaxially (although they may be arranged coaxially) as in the illumination optical system IU in the first modified example of the first embodiment in FIG. 11, the illumination optical system IU1 differs therefrom in that an optical path combining mirror 29 having a trapezoidal cross section in which a boundary portion 29C of two reflecting surfaces 29A, 29B constitutes a flat portion is employed in place of the optical path combining mirror 21. Therefore, in the illumination optical system IU1, illumination regions 24A and 24B formed on a reticle conjugate plane 62 (near which the boundary portion 29C is located) and illumination regions 25A and 25B formed on a reticle surface (the pattern surface of the reticles R1A and R1B here) from these illumination regions through a secondary relay optical system 22 are separated from each other by the interval of the pattern regions of the reticles R1A and R1B in the scanning direction (Y direction) in the full open state.

FIG. 18(b) shows the relationship between a field PL1F of the projection optical system PL1 in this example and illumination fields 18AP, 18BP formed so as to be substantially inscribed therein by the exposure light beams IL1, IL2 with the above-mentioned interval in the Y direction. The illumination regions 25A, 25B are opened and closed in the scanning direction within these illumination fields 18AP, 18BP. If a normal projection optical system is used in this case, the interval of the exposure regions corresponding to the illumination regions 25A, 25B will be widened by the interval of the pattern regions of the reticles R1A, R1B under the reduction of the projection optical system. Since the gap between shots on the wafer W is a narrow gap corresponding to the street line, however, the patterns of two reticles R1A, R1B cannot be transferred to two shot regions adjacent to each other in the Y direction on the wafer W through the projection optical system by one scanning exposure as they are.

Therefore, the projection optical system PL1 in this example is provided with an image shifter by which images of patterns within the illumination regions 25A, 25B widened in the Y direction on an object surface are projected with a narrowed interval so that they are adjacent to each other in the Y direction on the image surface. Namely, as shown in FIG. 17, a first image shifter P1, made of a light-transmitting member in a roof prism form having a ridge line in the X direction, functioning to narrow the gap between the light beams transmitted through the illumination regions 25A, 25B in the Y direction, and a second image shifter P2 having a V-shaped cross-sectional form complimentary to the image shifter P1 and functioning to restore the advancing directions of the two light beams with the narrowed gap to those at the time of incidence to the image shifter P1 are successively arranged from the reticle side in the space on the reticle side of the powered optical member group (including lenses, mirrors, and the like) PL1a in the optical members constituting the projection optical system PL1 in this example.

As a result, as shown in FIG. 18(c), the gap in the Y direction between the fully opened exposure regions 28A, 28B within an image field PL1G of the projection optical system PL1 becomes a narrow gap identical to the width of the street line between shots on the wafer W, whereby the patterns of two reticles R1A, R1B in FIG. 17 can be transferred to two shot regions adjacent to each other in the Y direction on the wafer W under their optimal illumination conditions by one scanning exposure.

Scanning Exposure Operation of Second Embodiment

Assuming that the shot regions adjacent to each other in the Y direction on the wafer W in FIG. 17 are the shot regions 48A, 48F in FIG. 20(a), the operation of transferring the patterns of two reticles R1A, R1B in FIG. 19(a) (arranged as in FIG. 18(a)) onto the shot regions 48A, 48F on the wafer W by one scanning exposure will be explained with reference to FIGS. 19(a) to (l) and FIGS. 20(a) to (l).

As with FIGS. 4(a) to (l), FIGS. 19(a) to (l) are views showing respective positional relationships between the reticles R1A, R1B and the two illumination regions 25A, 25B in FIG. 17 at the time of scanning exposure. FIGS. 20(a) to (l) are views showing positional relationships between the two shot regions 48A, 48F on the wafer W and the two exposure regions 28A, 28B by the projection optical system PL1 in FIG. 17 in the cases of FIGS. 19(a) to (l), respectively.

First, at the time when the pattern region of the reticle R1A enters the illumination field 18BP in FIG. 18(b), the second illumination region 25B starts to open as shown in FIG. 19(b) (exposure by the exposure region 28B with respect to the shot region 48 begins in FIG. 20(b) corresponding thereto). Only the pattern of the reticle R1A is illuminated with the fully open illumination region 25B in FIGS. 19(c), (d), and (e), while only the shot region 48F is exposed to the fully open exposure region 28B in FIGS. 20(c), (d), and (e) corresponding thereto.

Next, at the time when the pattern region of the reticle R1B enters the illumination field 18AP in FIG. 18(b), the first illumination region 25A starts to open as shown in FIG. 19(f) (the exposure region 28A on the shot region 48A begins to open in FIG. 20(f) corresponding thereto). Then, the reticles R1A, R1B are simultaneously illuminated with the illumination regions 25B, 25A up to FIGS. 19(g) and (h) (the shot regions 48A, 48F are simultaneously exposed to the exposure regions 28A, 28F up to FIGS. 20(g) and (h)). Thereafter, as shown in FIGS. 19(i) to (l), only the pattern region of the reticle R1B is illuminated with the first illumination region 25A (only the shot region 48A is exposed to the exposure region 28A in FIGS. 20(i) to (l) corresponding thereto), whereby reduced images of the patterns of the two reticles R1A, R1B are transferred to the two shot regions 48F, 48A adjacent to each other on the wafer W. Subsequently, performing the above-mentioned exposure by moving the wafer W stepwise by one shot region in the Y direction can double-expose the patterns of the two reticles R1A, R1B to one shot region on the wafer W with a high throughput as in the first embodiment. It will be sufficient if only different device patterns are exposed to shot regions adjacent to each other on the wafer W, without always necessitating the double exposure.

Since this example thus uses the projection optical system PL1 including the image shifters P1, P2, one scanning exposure can transfer a plurality of reticle patterns arranged with a predetermined interval in the Y direction to a plurality of shot regions adjacent to each other on the wafer W with a high throughput under their optimal conditions.

Modified Example of Second Embodiment

Figure 21:
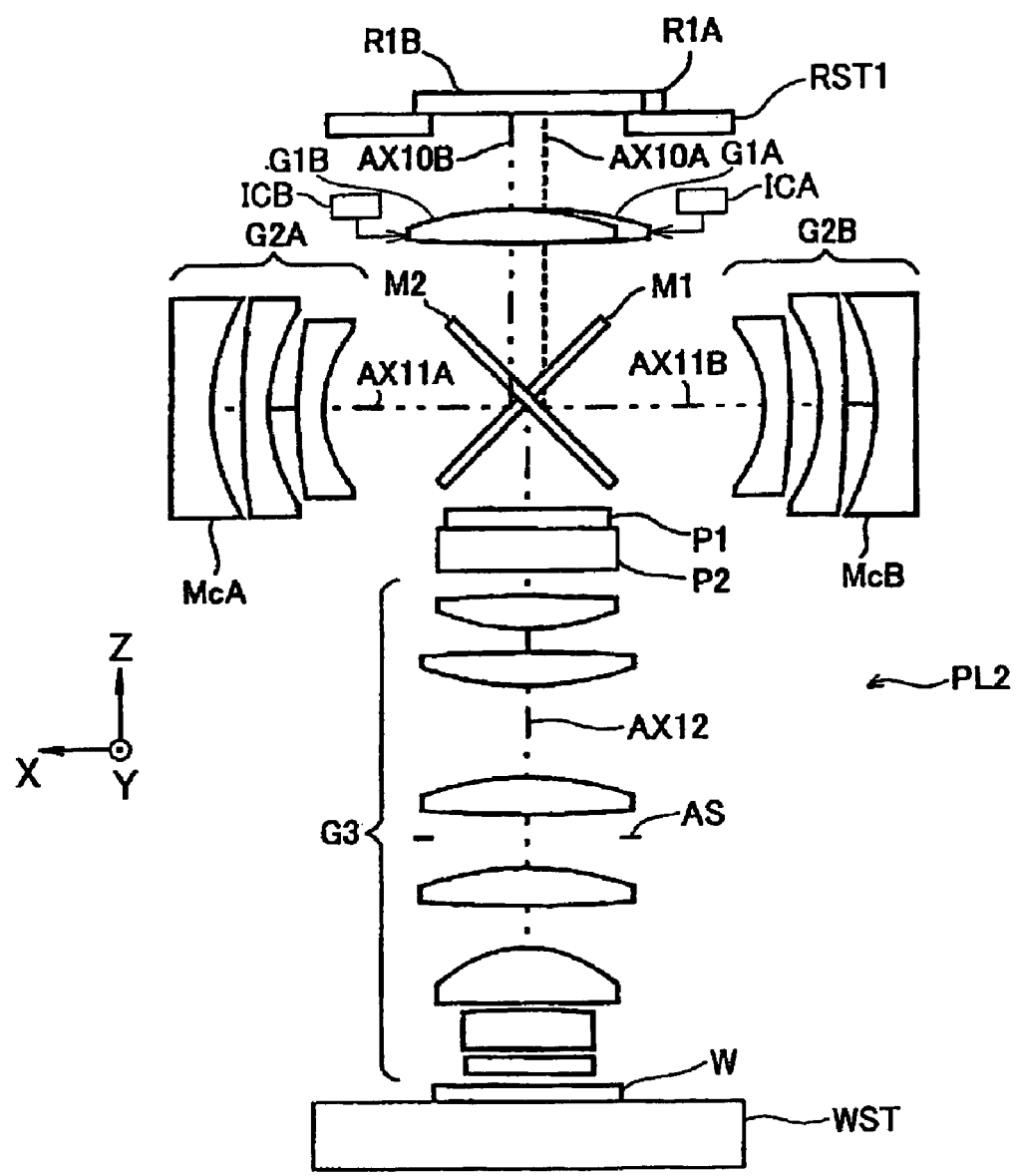
FIG. 21 is a view of the projection optical system and reticle stage in a modified example of the second embodiment as seen from the scanning direction.
Figure 22:
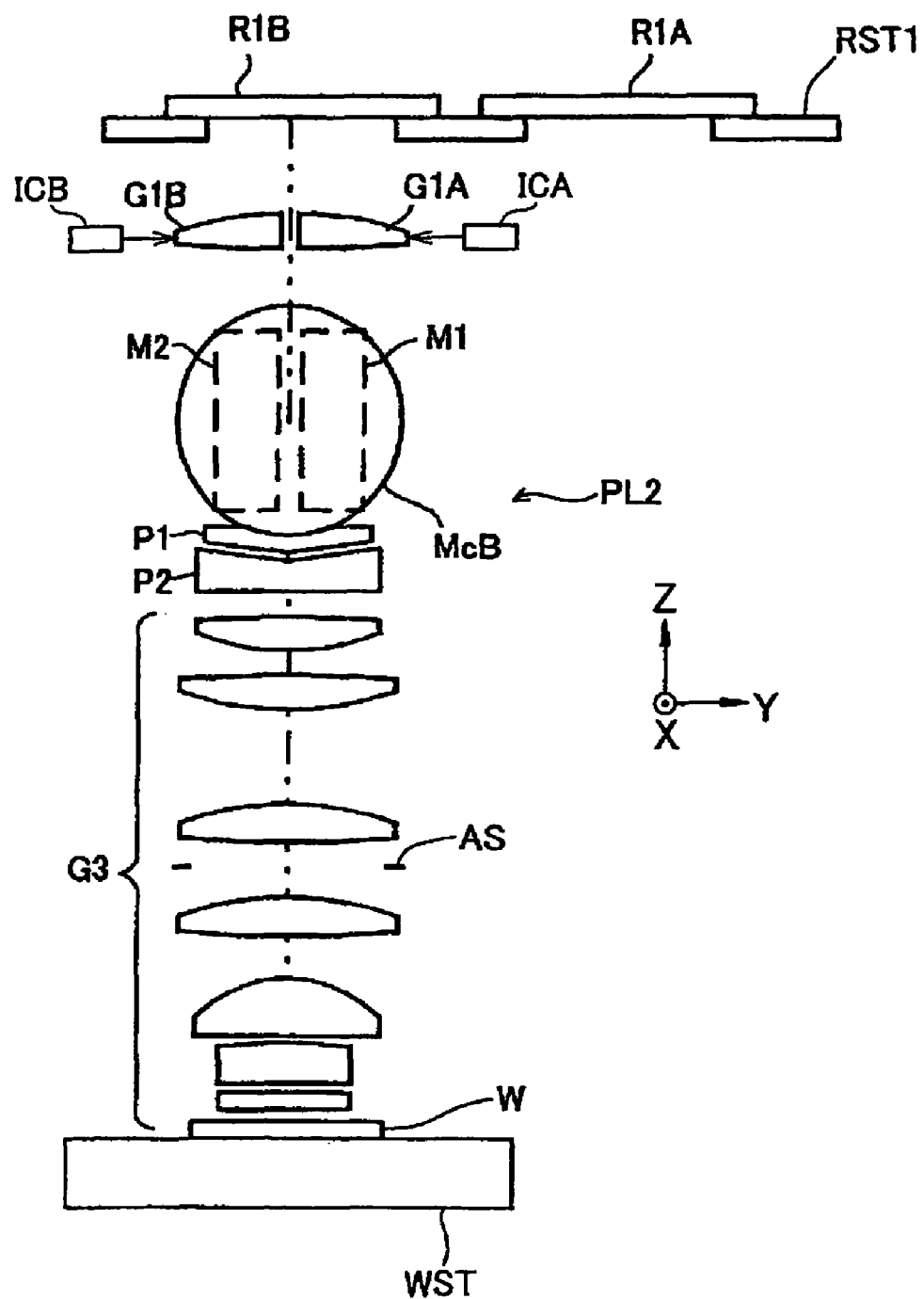
FIG. 22 is a view of the projection optical system and reticle stage of FIG. 21 as seen from the nonscanning direction.
Figure 23:
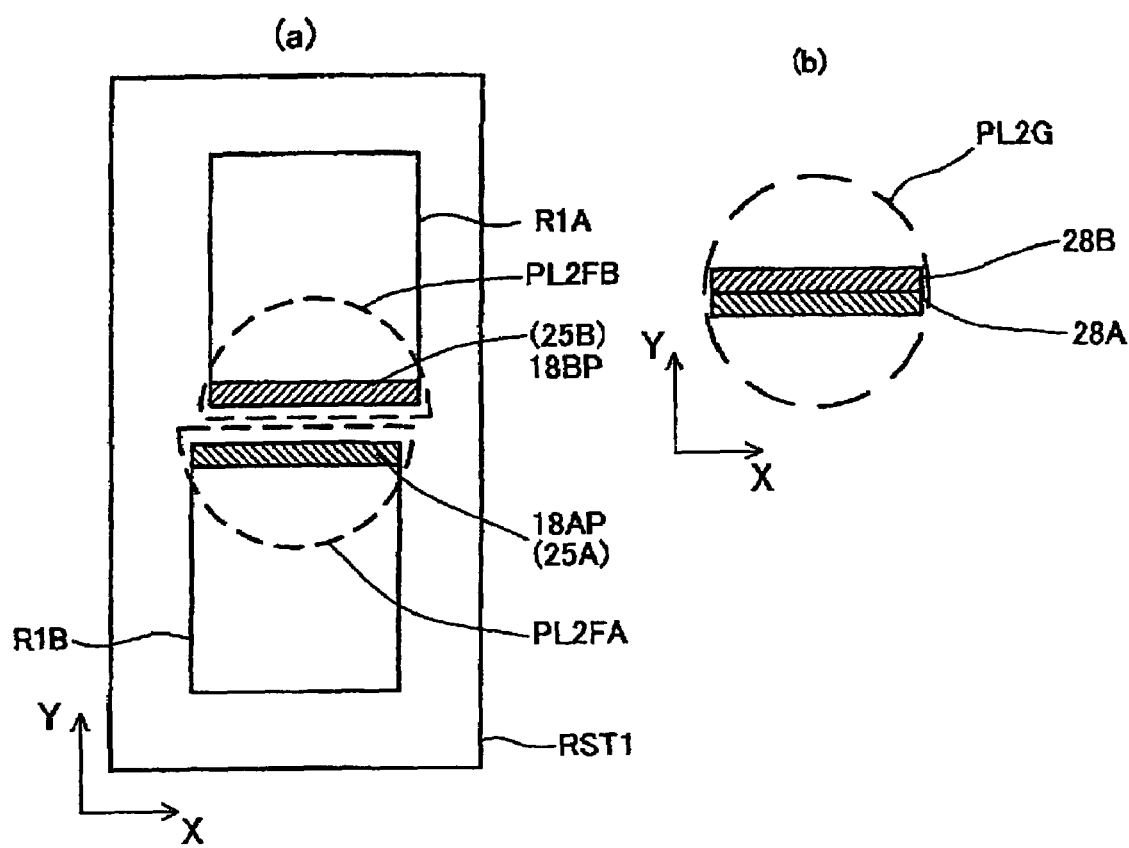
FIG. 23 is a plan view showing the relationship between reticles on the reticle stage of FIG. 21, the image field of the projection optical system of FIG. 21 and the exposure regions ((a) is a plan view showing two reticles on the reticle stage of FIG. 21, whereas (b) is a plan view showing the relationship between the image field of the projection optical system of FIG. 21 and the exposure regions).

FIG. 21 is a view showing the projection optical system PL2 and reticle stage RST1 of the projection exposure apparatus in a modified example of the second embodiment as seen in the scanning direction (+Y direction). FIG. 22 is a view showing the projection optical system PL2 and reticle stage RST1 of FIG. 21 as seen in a nonscanning direction (+X direction). FIG. 23(a) is a view showing the positional relationship between a plurality of (2 here) reticles R1A and R1B on the reticle stage RST1 of FIG. 21 and the illumination fields 18BP and 18AP within fields of view PL2FB and PL2FA of the projection optical system PL2G by an illumination optical system which is not depicted. FIG. 23(b) shows two fully opened exposure regions 28A, 28B within the image field PL2G of the projection optical system PL2 in FIG. 21.

The projection optical system PL2 in this modified example is a catadioptric projection optical system having at least one concave reflecting mirror. As shown in FIG. 21, the projection optical system PL2 comprises a plurality of (2 here) first groups G1A, G1B positioned on optical axes 10A, 10B parallel to each other, second groups G2A, G2B, positioned on optical axes AX11A, AX11B orthogonal to the optical axes AX10A, AX10B of the plurality of first groups G1A, G1B, including concave reflecting mirrors McA, McB, respectively; and a third group G3, positioned on an optical axis AX12 orthogonal to the optical axes AX11A, AX11B of the second groups G2A, G2B, including a plurality of lens elements. The projection optical system PL2 further comprises a planar mirror M1 which reflects light beams from the first group G1A toward the second group G2A and light beams from the second group G2B toward third group G3, a planar mirror M2 which reflects light beams from the first group G1B toward the second group G2B and light beams from the second group G2A toward the third group G3, and image shifters P1 and P2 (having the same forms as with the image shifters P1 and P2 in FIG. 17) positioned in an optical path between the planar mirrors M1, M2 and the third group G3.

The first group G1A and second group G2A form an intermediate image of the reticle R1A in an optical path near the planar mirror M2, whereas the first group G1B and second group G2B form an intermediate image of the reticle R1B in an optical path near the planar mirror M1. With their gap in the scanning direction narrowed by the image shifters P1, P2 having functions similar to those of the image shifters P1, P2 in the second embodiment (FIG. 17), the plurality of intermediate images are reimaged on the wafer W held by the wafer stage WST through the third group G3.

Since each of the planar mirrors M1, M2 is one in which both sides of an optical member formed like a plane parallel plate are formed with reflecting surfaces in the projection optical system PL2 in this modified example, the optical axis AX12 of the third group G3 and the respective optical axes AX10A and AX10B of the first groups G1A and G1B do not become coaxial (although parallel to each other). Therefore, in this modified example, a plurality of reticles R1A, R1B on the reticle stage RST1 are positioned in the nonscanning direction (X direction) such as to be shifted from each other by the gap between the optical axes AX10A and AX10B as shown in FIG. 23(a). This can make the positions in the nonscanning direction of the two exposure regions 28A, 28B within the image field PL2G (on the wafer W) of the projection optical system PL2 coincide with each other as shown in FIG. 18(b).

Each of the optical elements constituting the first groups G1A and G1B has a half-moon (semicircular) form substantially similar to the fields of view PL2FB and PL2FA in FIG. 23(a).

The projection optical system PL2 in this modified example has a first imaging optical system constituted by the first group G1A, second group G2A, and third group G3, and a second imaging optical system constituted by the first group G1B, second group G2B, and third group G3. Therefore, when an imaging characteristic controlling apparatus ICA, ICB (an apparatus including a mechanism for driving an optical member to be controlled in rotary directions about an optical axis direction and two axes orthogonal to each other within a plane perpendicular to the optical axis by using a piezoelectric device, for example) regulates the positions/postures of optical members constituting the plurality of first groups G1A, G1B which are located between the reticle surface and the image shifters P1, P2 and/or the positions/postures of optical members constituting the plurality of second groups G2A, G2B, the imaging state of images focused on the wafer W by light beams from the reticle R1A and the imaging state of images focused on the wafer W by light beams from the reticle R1B can be regulated independently of each other.

The aperture stop AS is positioned in the third group G3 in the projection optical system PL2 shown in FIGS. 21 and 22, but may be provided near the concave reflecting mirrors McA, McB in the second groups G2A, G2B. When a plurality of aperture stops are thus provided in the second groups G2A, G2B, the coherence factor (a value) concerning the first imaging optical system through which light beams from the reticle R1A pass and the coherence factor (a value) concerning the second imaging optical system through which light beams from the reticle R1B pass can be regulated independently of each other.

Third Embodiment

A third embodiment of the present invention will now be explained with reference to FIGS. 24 to 30. This example also employs the embodiment in the case carrying out exposure by using a projection exposure apparatus of scanning stepper type. In FIGS. 24 to 30, parts corresponding to those in FIGS. 1 to 10 will be referred with the same numerals without repeating their detailed explanations. In this example, unlike the first embodiment, an optical path combiner also renders a part of functions of a movable blind.

Figure 24:
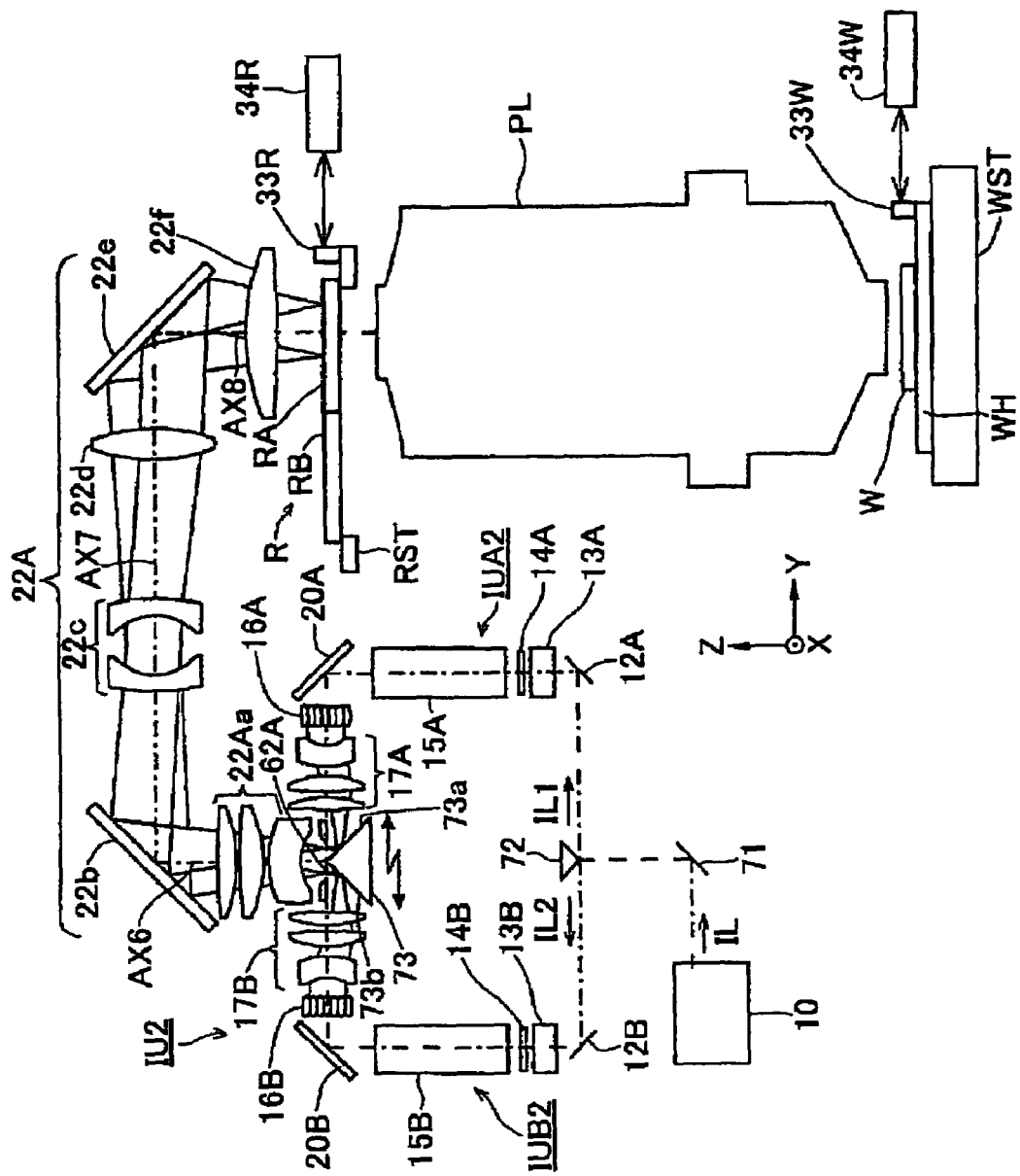
FIG. 24 is a view showing a schematic structure of the projection exposure apparatus in the third embodiment of the present invention.

FIG. 24 shows a schematic structure of the projection exposure apparatus in this example. In FIG. 24, exposure light (exposure illumination light) constituted by linearly polarized UV pulsed laser light emitted from an exposure light source 10 is reflected by a mirror 71, and then is divided into a first exposure light beam IL1 and a second exposure light beam IL2 by an optical divider 72 having a mirror with two surfaces, whereas the exposure light beams IL1 and IL2 are reflected by mirrors 12A and 12B, respectively, so as to be made incident on a first illumination unit IUA and a second illumination unit IUB which have structures symmetrical to each other. By way of their corresponding illumination units IUA2, IUB2 comprising polarization controllers 13A, 13B, replaceable diffractive optical elements 14A, 14B, shaping optical systems 15A, 15B, optical path folding mirrors 20A, 20B, optical integrators 16A, 16B, and condenser optical systems 17A, 17B, the exposure light beams IL1, IL2 are reflected by reflecting surfaces 73a and 73b orthogonal to each other in a movable optical path combining mirror 73, respectively, so as to illuminate a reticle conjugate plane 62A (surface optically conjugate with the reticle surface about a secondary relay optical system 22A which will be explained later).

Figure 25:
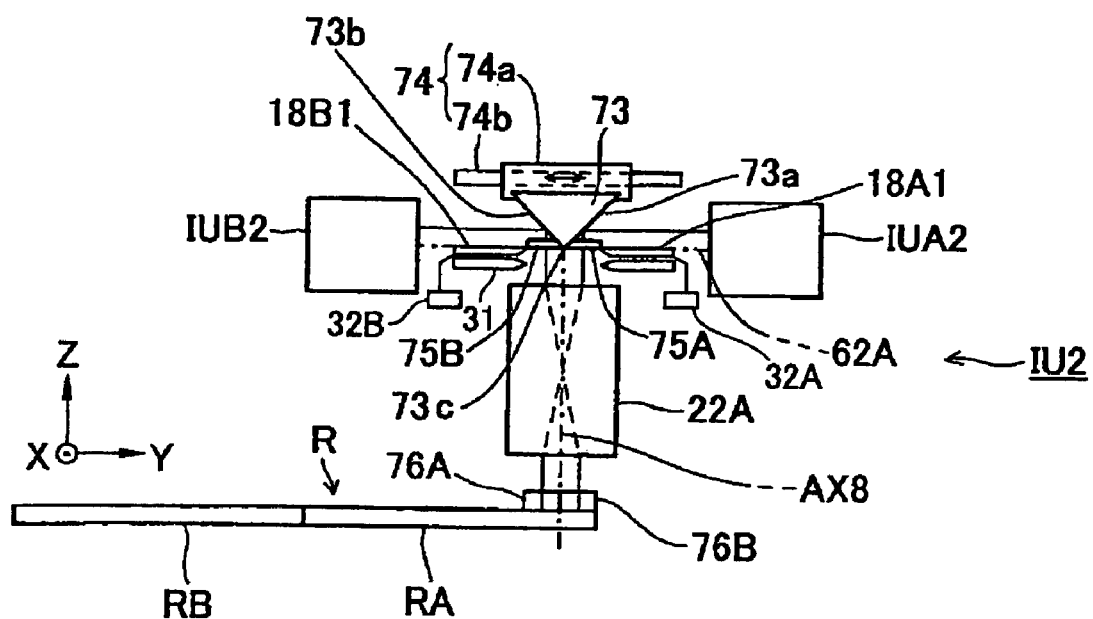
FIG. 25 is a view schematically showing the illumination optical system IU2 in the projection exposure apparatus of FIG. 24.

FIG. 25 is a view schematically showing the illumination optical system IU2 of FIG. 24 in this example. As shown in FIG. 25, a ridge line 73c at the boundary between the two reflecting surfaces 73a, 73b of the optical path combining mirror 73 is positioned on the reticle conjugate plane 62A, while movable blinds 18A1 and 18B1 provided one by one for the illumination units IUA2 and IUB2 are arranged on the reticle conjugate plane 62A such that their gaps to the ridge line 73c are independently controllable by a driving mechanism 32A, 32B. A fixed blind 31 for the illumination units IUA2 and IUB2 is placed at a position slightly defocused from the reticle conjugate plane 62A. While the fixed blinds 31A, 31B of FIG. 1 in the first embodiment are arranged at positions slightly defocused from the reticle conjugate plane 62 on the upstream side of the movable blinds 18A, 18B, the fixed blind 31 in this example differs therefrom in that it is placed at a position slightly defocused from the reticle conjugate plane 62A on the downstream side of the movable blinds 18A1, 18B1.

A variable slit disclosed in International Publication No. 2005/048326 Pamphlet and the corresponding U.S. Published Application No. 2007/0014112, for example, can be placed at any of the positions of the fixed blinds 31A, 31B, and 31 in the embodiments. Employing this structure can regulate respective illumination irregularities in a plurality of illumination fields independently of each other. U.S. Published Application No. 2007/0014112 is incorporated as a reference herein.

The optical path combining mirror 73 of this example is driven by a driving mechanism 74 such as a linear motor constituted by a rotor 74a and a stator 74b such that the ridge line 73c moves within the aperture of the fixed blind 31 along the reticle conjugate plane 62A. The movable blinds 18A1 and 18B1 are driven such as to open and close the aperture between the ridge line 73 and the end portion of the fixed blind 31. The optical path combining mirror 73 and the movable blinds 18A1, 18B1 are driven according to the position of the reticle R in the scanning direction by an unshown driving system similar to the stage driving system 35 in FIG. 1.

Returning to FIG. 24, the exposure light beams IL1, 112 transmitted through the apertures of the movable blinds 18A1, 18B1 and fixed blind 31 in FIG. 25 illuminate patterns provided on a pattern surface (reticle surface) of a reticle R through a secondary relay optical system 22A comprising lens systems 22Aa to 22f. The illumination optical system 112 includes the above-mentioned illumination units IUA2 and IUB2, movable blinds 18A1 and 18B1, fixed blind 31, movable optical path combining mirror 73, and secondary relay optical system 22A.

As shown in FIG. 25, illumination regions 75A, 75B (apertures between the ridge line 73c of the optical path combining mirror 73 and the movable blinds 18A1, 18B1) formed on the reticle conjugate plane 62A by the exposure light beams from the illumination units IUA2, IUB2 are reimaged by the secondary relay optical system 22A as first and second illumination regions 76A and 76B adjacent to each other in the scanning direction (Y direction) on the reticle R. Thus, the ridge line 73c of the optical path combining mirror 73 also functions as a movable blind which is a counterpart of the movable blinds 18A1 and 18B1. In the following, the aperture between the movable blind 18A1 and the ridge line 73c will be referred to as the aperture of the movable blind 18A1, whereas the aperture between the movable blind 18B1 and the ridge line 73c will be referred to as the aperture of the movable blind 18B1.

FIG. 26(a) is a view showing the relationship between the field PLF of the projection optical system PL in his example and a first illumination field 77A and a second illumination field 77B which are images of fully opened apertures of the movable blinds 18A1 and 18B1 in FIG. 25. In FIG. 26(a), the first illumination field 77A and second illumination field 77B have the same size and are located at the same position while being substantially inscribed in the contour of the field PLF of the projection optical system PL. The illumination fields 76A, 76B in FIG. 25 are opened and closed so as not to overlap each other within their corresponding fields of view 77A, 77B. The width in the scanning direction of the illumination fields 77A, 77B in FIG. 26(a) is about twice that of the illumination fields 18AP, 18BP of FIG. 3 in the first embodiment.

As a result, in the image field PLG of the projection optical system PL shown in FIG. 26(b), the exposure regions 78A, 78B corresponding to the fully opened illumination regions 76A, 76B become regions identical to each other, whose width in the scanning direction is about twice that in the case of the first embodiment. Therefore, the integrated amount of exposure at the time of scanning exposure is about twice that of the first embodiment, whereby the scanning speed of the wafer W can be increased, so as to improve throughput Since the number of pulses of irradiating exposure light on the wafer W becomes greater, the unevenness in illuminance decreases. By using a light source with a short pulse emission interval (light source having a high pulse emission frequency) as the exposure light source 10, the first embodiment can also reduce the unevenness in illuminance even when the width in the scanning direction of the illumination field is about a half of this example.

Returning to FIG. 24, under the exposure light beams IL1, IL2, patterns within illumination regions on the reticle R are projected to exposure regions on the wafer W at a predetermined projection magnification β (where β is ¼, ⅕, or the like) through the projection optical system PL. The other structures are the same as those in the first embodiment.

An example of exposure operations of the projection exposure apparatus in this example will now be explained. As shown in FIG. 27(a), the pattern surface of the reticle R in this example is divided by a light-shielding band 53 at the boundary into two pattern regions RA, RB in the Y direction, whereas patterns A and B are formed within the pattern regions RA and RB, respectively. One scanning exposure exposes images of the patterns A, B of the two pattern regions RA, RB in the reticle R to two shot regions adjacent to each other in the scanning direction on the wafer W.

FIGS. 27(a) to (l) are views showing positional relationships between a plurality of pattern regions RA, RB of the reticle R and two illumination regions 76A, 76B in FIG. 25 at the time of scanning exposure. FIGS. 28(a) to (d) show the states of apertures of the movable blinds 18A1, 18B1 (one of which is defined by the ridge line 73c) in the cases of FIGS. 27(a) to (d), respectively. FIGS. 29(e) to (h) show the states of apertures of the movable blinds 18A1, 18B1 in the cases of FIGS. 27(e) to (h), respectively. FIGS. 30(i) to (l) show the states of apertures of the movable blinds 18A1, 18B1 in the cases of FIGS. 27(i) to (l), respectively.

At the time when the pattern region RA of the reticle R enters the illumination field 77B after starting the scanning of the reticle R in the +Y direction, the second illumination region 76B begins to open as shown in FIG. 27(b) (the movable blind 18B1 begins to open in FIG. 28(b) corresponding thereto). Subsequently, in the state where only the pattern region RA passes the illumination field 77B in FIG. 26, the reticle R is scanned with respect to the second illumination region 76B as in FIGS. 27(c), (d), and (e) (only the movable blind 18B1 is in the open state in FIGS. 28(c), (d), and FIG. 29(e) corresponding thereto). Consequently, only an image of the pattern in the first pattern region RA in the reticle R is sequentially exposed to one shot region of the wafer W.

Figure 26:
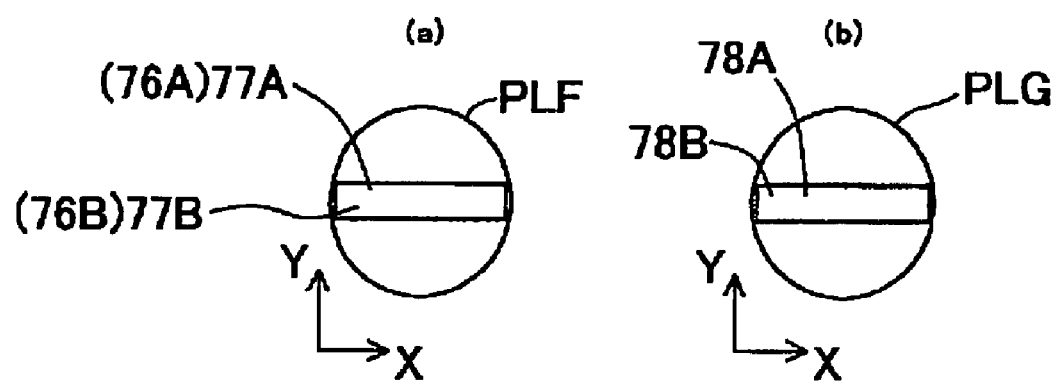
FIG. 26 is a view showing the relationship between the field of the projection optical system PL in FIG. 24, the illumination fields, the image field of the projection optical system PL in FIG. 24 and the exposure regions ((a) is a view showing the relationship between the field of the projection optical system PL in FIG. 24 and the illumination fields, whereas (b) is a view showing the relationship between the image field of the projection optical system PL in FIG. 24 and the exposure regions).
Figure 27:
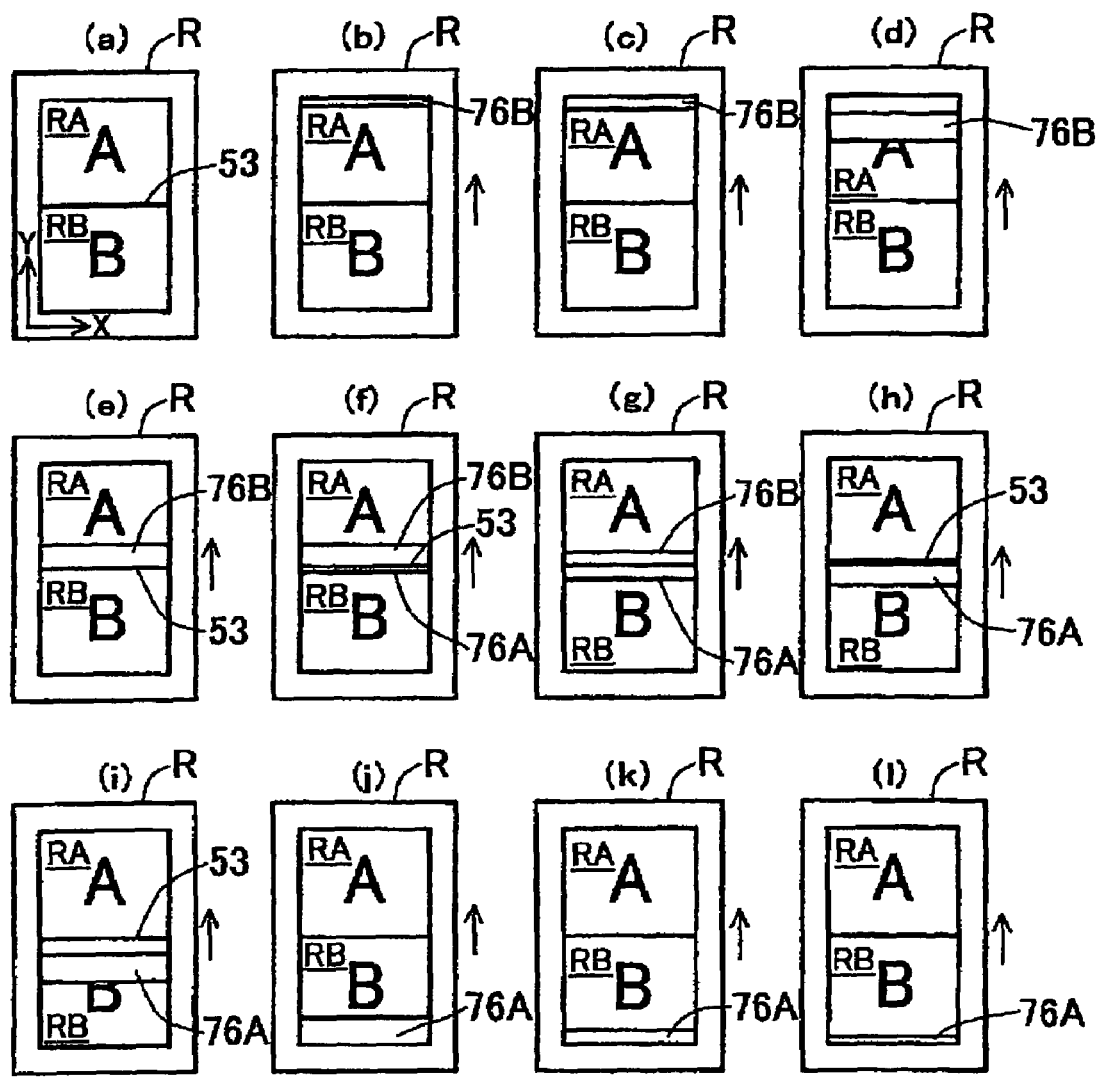
FIG. 27 is a view showing an example of changes in the positional relationship between the pattern regions RA, RB of the reticle R in FIG. 24 and the illumination regions 76A, 76B.
Figure 28:
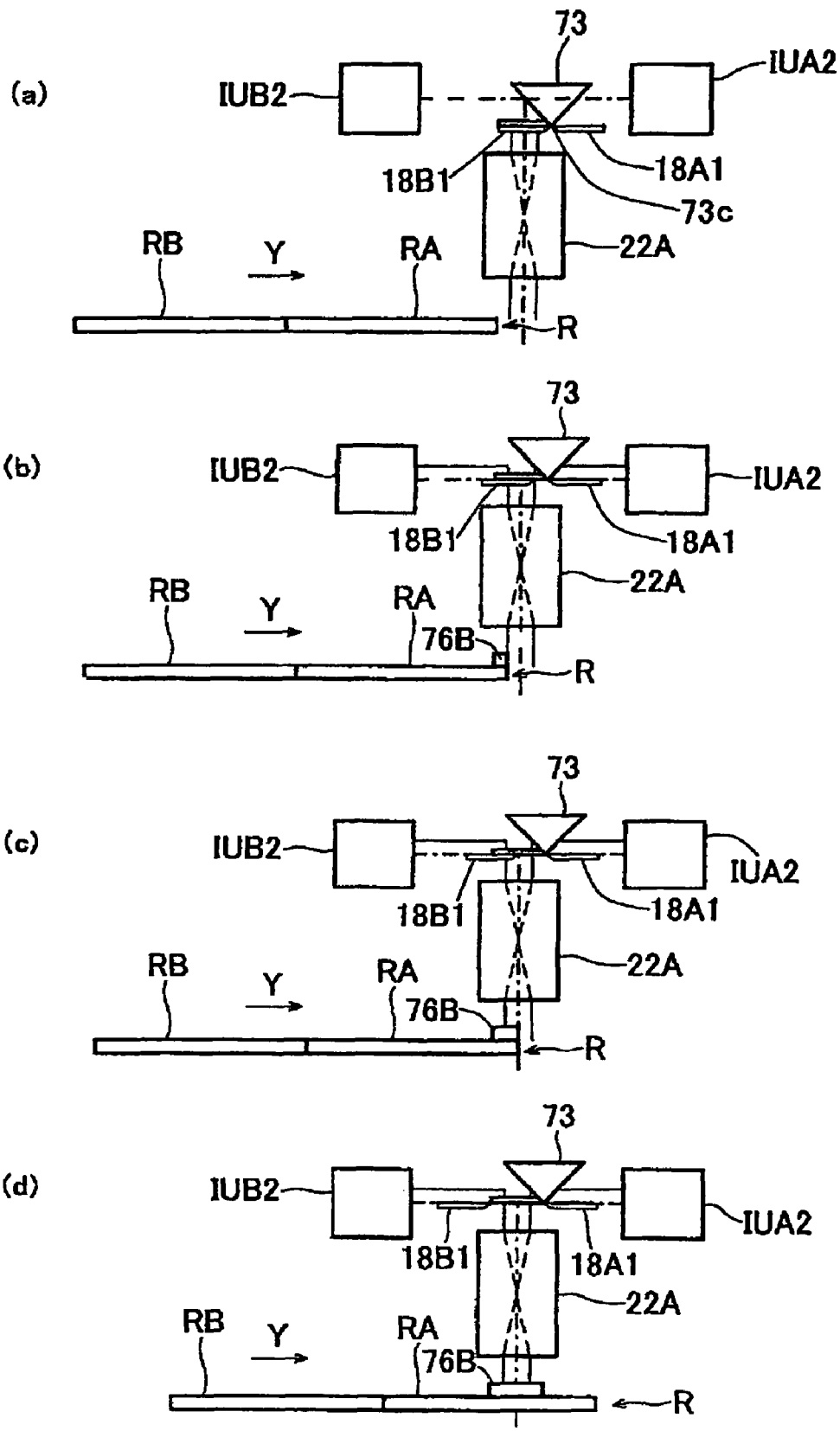
FIG. 28 is a view showing an example of changes in the apertures of the movable blinds 18A1, 18B1 corresponding to the changes in the state on the first line of FIG. 27.
Figure 29:
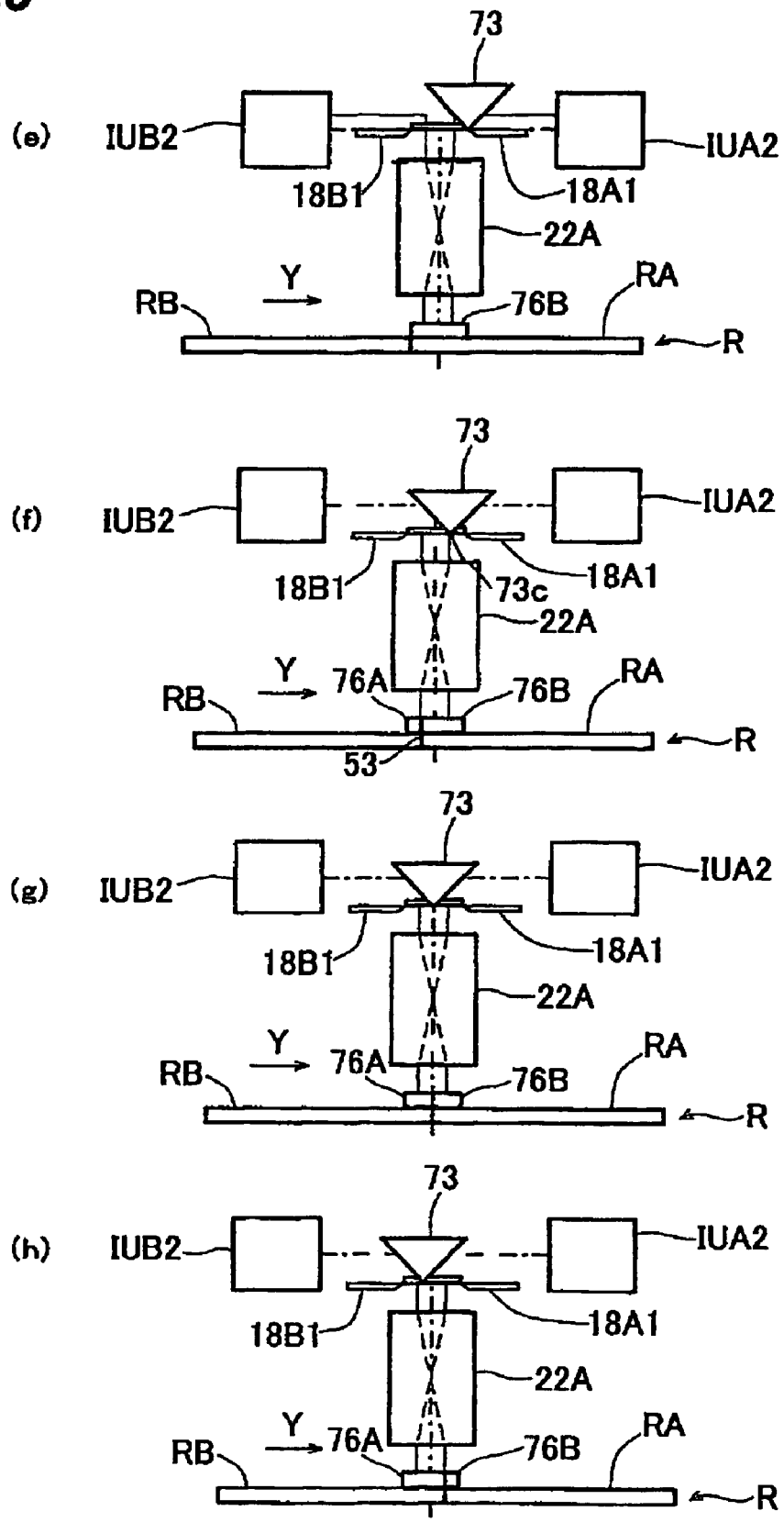
FIG. 29 is a view showing an example of changes in the apertures of the movable blinds 18A1, 18B1 corresponding to the changes in the state on the second line of FIG. 27.
Figure 30:
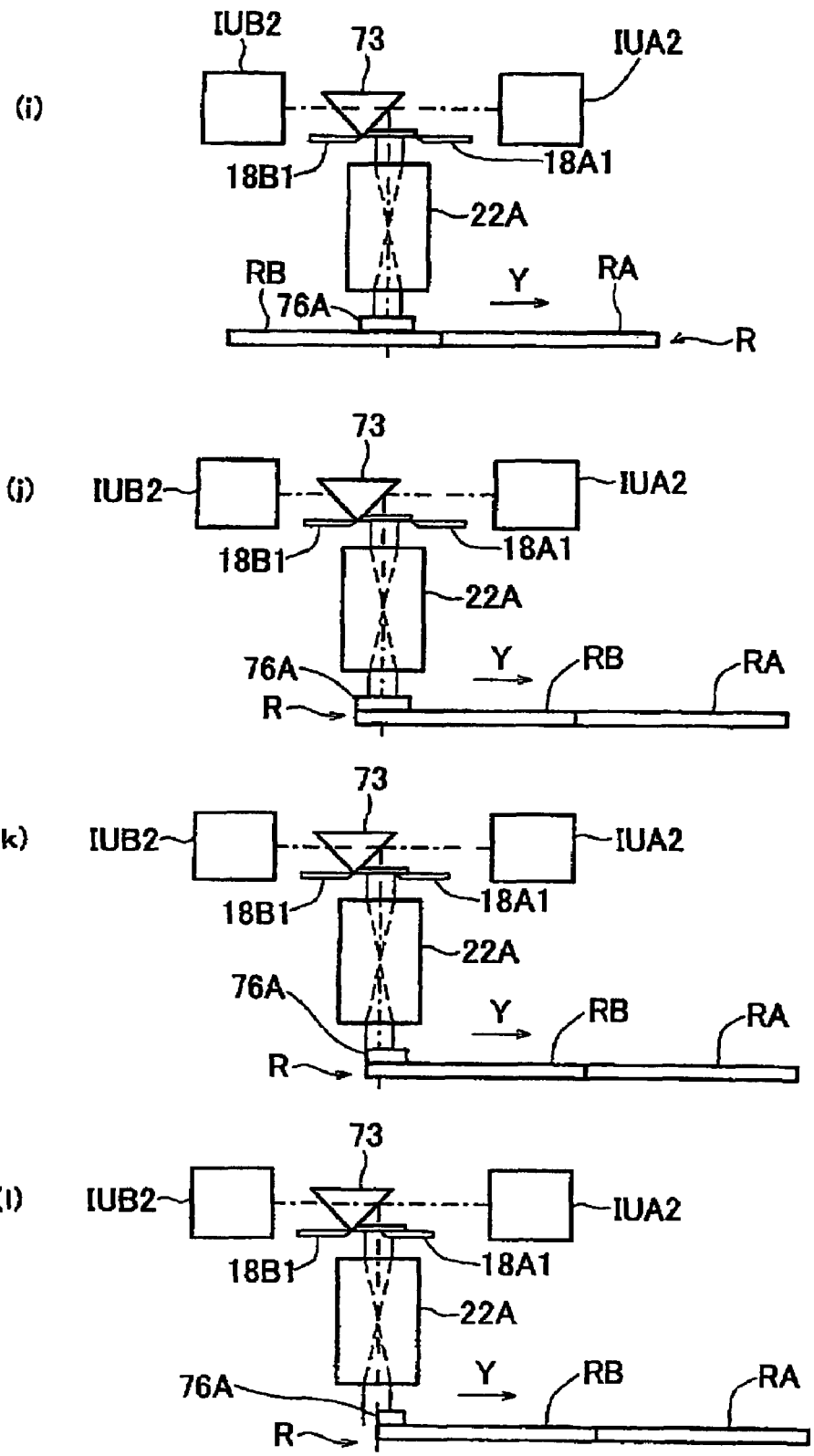
FIG. 30 is a view showing an example of changes in the apertures of the movable blinds 18A1, 18B1 corresponding to the changes in the state on the third line of FIG. 27.

Next, at the time when the pattern region RB of the reticle R enters the illumination field 77A of FIG. 26 in the state where the pattern region RA is illuminated with the second illumination region 76B as shown in FIG. 27(f), the first illumination region 76A starts to open, while the second illumination region 76B starts to close (the movable blind 18A1 begins to open while the movable blind 18B1 begins to close in FIG. 29(f) corresponding thereto). In FIG. 27(g), the illumination regions 76A, 76B attain the same size (with a width which is ½ of the maximum width) (the apertures of the movable blinds 18A1, 18B1 become symmetrical to each other in FIG. 29(g) corresponding thereto). Before and after this state, the image of the ridge line 73c of the optical path combining mirror 73 in FIG. 25 moves in the Y direction so as to follow the light-shielding band at the boundary between the two pattern regions RA, RB in FIG. 24.

Thereafter, as the reticle R is further scanned in the +Y direction, the second illumination region 76B is gradually closed as shown in FIG. 27(h) (the movable blind 18B1 is gradually closed in FIG. 29(h) corresponding thereto). In the state of FIG. 27(i), the first illumination region 76A is fully open, so that only the second pattern region RB of the reticle R is illuminated with the first illumination region 76A (the movable blind 18B1 is completely closed in FIG. 30(i) corresponding thereto). Thereafter, as shown in FIGS. 27(j) to (l), only the second pattern region RB of the reticle R is illuminated with the first illumination region 76A (only the movable blind 18A1 is in the open state in FIGS. 30(j) to (l) corresponding thereto), whereby the image of the pattern in the second pattern region RB is sequentially exposed to the second shot region of the wafer W. Thereafter, the wafer W is moved stepwise in the Y direction by the width of one shot region, and the above-mentioned scanning exposure is performed, whereby the patterns within the pattern regions RA, RB of the reticle R are double-exposed to the intermediate shot region.

Thus, as shown in FIG. 24, the optical path combining mirror 73 is moved in synchronization with the scanning of the reticle R, so as to be used as one of the movable blinds 18A1, 18B1 as well, whereby the movable blind mechanism can be simplified in this example. Further, a plurality of pattern regions RA, RB in the reticle R can be illuminated with broad illumination regions substantially inscribed in the field of the projection optical system PL, respectively, so that the integrated amount of exposure becomes higher on the wafer W, whereby the scanning speed of the wafer W can be raised, so as to improve the throughput of the exposure block.

The exposure apparatus (projection exposure apparatus) of the above-mentioned embodiment can be manufactured by placing a column structure which is not depicted; then incorporating an illumination optical system constituted by a plurality of optical members and a projection optical system into a main body of an exposure apparatus; optically adjusting them; attaching reticle and wafer stages constituted by a number of mechanical components to the main body of the exposure apparatus; connecting leads and pipes thereto; and conducting total adjustment (electric adjustment, verification of operations, etc.). Preferably, the exposure apparatus is manufactured in a clean room where the temperature, cleanness, and the like are controlled.

When manufacturing a semiconductor device by using the exposure apparatus of the above-mentioned embodiment, the semiconductor device is manufactured by way of designing functions/performances of the device; manufacturing a reticle according to the former block; forming a wafer from a silicon material; causing the projection exposure apparatus of the above-mentioned embodiment to perform alignment and expose a pattern of the reticle to the wafer, forming a circuit pattern such as etching; a device assembling block (including dicing, bonding, and packaging blocks); inspecting block; and the like.

The above embodiments are applicable not only to the projection exposure apparatus of scanning exposure type, but also to those of cell projection type (stepper type). The above embodiments are also applicable to cases where exposure is carried out by the exposure apparatus of liquid immersion type disclosed in International Publication No. 99/49504 Pamphlet, for example. In this case, at the time of scanning exposure, a liquid supply apparatus 5, 21a which is disclosed in International Publication No. 99/49504 Pamphlet locally supplies a liquid such as deionized water between the projection optical system PL and the wafer W, whereas the supplied liquid is collected by a liquid recovery (collecting) apparatus which is disclosed in International Publication No. 99/49504 Pamphlet. International Publication No. 99/49504 Pamphlet is incorporated as reference herein.

The above embodiments are also applicable to cases where exposure is carried out by a projection exposure apparatus using extreme ultraviolet light (EUV light) having a wavelength on the order of several nm to 100 nm as an exposure light beam.

The above embodiments are not limited to the application to exposure apparatus for manufacturing semiconductor devices, but is widely employable in exposure apparatus for liquid crystal display devices formed on angular glass plates or display apparatus such as plasma displays and exposure apparatus for manufacturing various devices such as imaging devices (CCD and the like), micromachines, thin film magnetic heads, and DNA chips. Further, the above embodiments are applicable to exposure blocks (exposure apparatus) when manufacturing masks (photomasks, reticles, and the like) formed with mask patterns of various devices by using photolithography blocks. Thus, the above embodiments are not limited to the above-mentioned cases, but can take various structures within the scope not deviating from the gist of the present invention.

The invention is not limited to the fore going embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical apparatus, used in a projection exposure apparatus which projects and exposes a pattern arranged in a reticle plane to a second plane, which supplies the reticle plane with illumination light from a light source, the illumination optical apparatus comprising:
   a relay optical system, arranged between the light source and the reticle plane, which forms a third plane optically conjugate with the reticle plane between the light source and the reticle plane, the relay optical system being located between the third plane and the reticle plane;
   an optical path combiner, arranged in an optical path between the light source and the reticle plane, for combining a first light beam from the light source and a second light beam different from the first light beam such that the first and second light beams illuminate the reticle plane closely to each other; and
   a field stop that is arranged at a position at which the third plane is located or at a light source side position in the optical path that is optically conjugate with the third plane,
   the field stop including a first movable blind arranged in an optical path of the first light beam, and a second movable blind arranged in an optical path of the second light beam;
   a first preliminary relay optical system arranged in an optical path between the first movable blind and the third plane; and
   a second preliminary relay optical system arranged in an optical path between the second movable blind and the third plane,
   wherein the optical path combiner includes a first region corresponding to the first light beam and a second region, separated from the first region, corresponding to the second light beam;
   a boundary between the first and second regions is arranged on or near the third plane; and
   the optical axes of the relay optical system, the first preliminary relay optical system and the second preliminary relay optical system intersect.

2. An illumination optical apparatus according to claim 1, wherein a number of the light source is 1; and
   the illumination optical apparatus further comprises a multiple-light-beam generator, arranged in an optical path between the light source and the optical path combiner, which divides the illumination light from the light source into the first and second light beams.

3. An illumination optical apparatus according to claim 1, wherein at least one of the first and second regions of the optical path combiner includes a reflecting surface.

4. An illumination optical apparatus according to claim 3, wherein each of the first and second regions of the optical path combiner includes a reflecting surface.

5. An illumination optical apparatus according to claim 1, wherein at least one of the first and second regions of the optical path combiner includes a refracting surface.

6. An illumination optical apparatus according to claim 1, further comprising first and second illumination units which supply the first and second light beams to the first and second movable blinds.

7. An illumination optical apparatus according to claim 1, wherein the optical path combiner is scannable in a direction corresponding to a direction in which the first and second light beams are separated from each other on the reticle plane.

8. An illumination optical apparatus according to claim 1, wherein the first and second light beams include incidence angle distributions different from each other when incident on the reticle plane.

9. An illumination optical apparatus according to claim 1, wherein the first and second light beams include polarization states different from each other when incident on the reticle plane.

10. An illumination optical apparatus according to claim 1, wherein the first and second light beams include illuminances different from each other on the reticle plane.

11. A projection exposure apparatus which illuminates a pattern with illumination light and exposing a photosensitive substrate through the pattern and a projection optical system; the projection exposure apparatus comprising the illumination optical apparatus according to claim 1.

12. A projection exposure apparatus according to claim 11, wherein the projection optical system includes an image shifter which shifts positions of respective images formed by the first and second light beams relative to each other.

13. A projection exposure apparatus according to claim 11, wherein the projection exposure apparatus performs exposure by moving, in synchronization with moving a pattern arranged on the reticle plane in a predetermined scanning direction, a photosensitive substrate arranged on the second plane in a direction corresponding thereto; and
   wherein the pattern arranged on the reticle plane includes a plurality of pattern regions arranged along the scanning direction.

14. A device manufacturing method comprising:
   exposing the pattern to the substrate by using the projection exposure apparatus according to claim 13; and
   developing the substrate;
   wherein the plurality of pattern regions are formed on one mask.

15. A device manufacturing method according to claim 14, wherein the pattern includes first and second pattern regions arranged along the scanning direction; and
   wherein, while the first and second pattern regions are respectively illuminated with the first and second light beams, patterns of the first and second pattern regions are respectively transferred to first and second sectioned regions adjacent to each other on the substrate by one scanning exposure.

16. A device manufacturing method comprising:
   exposing the pattern to the substrate by using the projection exposure apparatus according to claim 13; and
   developing the substrate;
   wherein the plurality of pattern regions are formed on a plurality of masks.

17. A device manufacturing method according to claim 16, wherein the pattern has first and second pattern regions arranged along the scanning direction;
   wherein, while the first and second pattern regions are respectively illuminated with the first and second light beams, patterns of the first and second pattern regions are respectively transferred to first and second sectioned regions adjacent to each other on the substrate by one scanning exposure.

18. A device manufacturing method comprising:
exposing the pattern to the substrate by using the projection exposure apparatus according to claim 11; and
developing the substrate.

19. An illumination optical apparatus, used in a projection exposure apparatus for projecting and exposing a pattern arranged in a reticle plane to a second plane, which supplies the reticle plane with illumination light from a light source;
the illumination optical apparatus comprising:
an optical path combiner, arranged in an optical path between the light source and the reticle plane, for combining a plurality of light beams different from each other from the light source such that first and second light beams illuminate the reticle plane closely to each other.
a relay optical system, arranged between the light source and the reticle plane, which forms a third plane optically conjugate with the reticle plane between the light source and the reticle plane, the relay optical system is located between the third plane and the reticle plane;
a field stop that is arranged at a position at which the third plane is located or at a light source side position in the optical path that is optically conjugate with the third plane;
the field stop includes a first movable blind arranged in an optical path of the first light beam, and a second movable blind arranged in an optical path of the second light beam;
a first preliminary relay optical system arranged in an optical path between the first movable blind and the third plane; and
a second preliminary relay optical system arranged in an optical path between the second movable blind and the third plane,
wherein the optical path combiner includes a discrete point positioned on or near the third plane optically conjugate with the first reticle plane;
the plurality of light beams travel by way of a plurality of regions sectioned by the third plane, respectively; and
the optical axes of the relay optical system, the first preliminary relay optical system and the second preliminary relay optical system intersect.

20. An illumination optical apparatus according to claim 19, wherein the discrete point of the optical path combiner is included in a line formed at two surfaces of the optical path combiner.

21. A projection exposure apparatus which illuminates a pattern with illumination light and exposes a photosensitive substrate through the pattern and a projection optical system; the projection exposure apparatus comprising the illumination optical apparatus according to claim 19.

22. A projection exposure apparatus according to claim 21, wherein the projection optical system includes an image shifter which shifts positions of respective images formed by the first and second light beams relative to each other.

23. A projection exposure apparatus according to claim 21, wherein the projection exposure apparatus performs exposure by moving, in synchronization with moving a pattern arranged on the reticle plane in a predetermined scanning direction, a photosensitive substrate arranged on the second plane in a direction corresponding thereto; and
wherein the pattern arranged on the reticle plane includes a plurality of pattern regions arranged along the scanning direction.

24. A device manufacturing method comprising:
exposing the pattern to the substrate by using the projection exposure apparatus according to claim 23; and
developing the substrate;
wherein the plurality of pattern regions are formed on one mask.

25. A device manufacturing method according to claim 24, wherein the pattern has first and second pattern regions arranged along the scanning direction; and
wherein, while the first and second pattern regions are respectively illuminated with the first and second light beams, patterns of the first and second pattern regions are respectively transferred to first and second sectioned regions adjacent to each other on the substrate by one scanning exposure.

26. A device manufacturing method comprising:
exposing the pattern to the substrate by using the projection exposure apparatus according to claim 23; and
developing the substrate;
wherein the plurality of pattern regions are formed on a plurality of masks.

27. A device manufacturing method according to claim 26, wherein the pattern has first and second pattern regions arranged along the scanning direction; and
wherein, while the first and second pattern regions are respectively illuminated with the first and second light beams, patterns of the first and second pattern regions are respectively transferred to first and second sectioned regions adjacent to each other on the substrate by one scanning exposure.

28. A device manufacturing method comprising:
exposing the pattern to the substrate by using the projection exposure apparatus according to claim 21; and
developing the substrate.

* * * * *